United States Patent
Cheng et al.

(10) Patent No.: US 9,105,522 B2
(45) Date of Patent: Aug. 11, 2015

(54) QUANTUM TUNNELING DEVICES AND CIRCUITS WITH LATTICE-MISMATCHED SEMICONDUCTOR STRUCTURES

(71) Applicant: Taiwan Semiconductor Manufacturing Company, Ltd., Hsin-Chu (TW)

(72) Inventors: Zhiyuan Cheng, Lincoln, MA (US); Calvin Sheen, Derry, NH (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/485,443

(22) Filed: Sep. 12, 2014

(65) Prior Publication Data

US 2015/0001469 A1 Jan. 1, 2015

Related U.S. Application Data

(60) Continuation of application No. 14/109,478, filed on Dec. 17, 2013, now Pat. No. 8,860,160, which is a continuation of application No. 13/544,661, filed on Jul. 9, 2012, now Pat. No. 8,629,047, which is a division of application No. 12/973,616, filed on Dec. 20, 2010, now Pat. No. 8,216,951, which is a division of application No. 11/862,850, filed on Sep. 27, 2007, now Pat. No. 7,875,958.

(60) Provisional application No. 60/848,037, filed on Sep. 27, 2006, provisional application No. 60/923,838, filed on Apr. 17, 2007.

(51) Int. Cl.
*H01L 27/22* (2006.01)
*H01L 29/12* (2006.01)
*B82Y 10/00* (2011.01)
(Continued)

(52) U.S. Cl.
CPC .............. *H01L 29/122* (2013.01); *B82Y 10/00* (2013.01); *G11C 11/16* (2013.01); *H01L 27/11* (2013.01); *H01L 27/24* (2013.01); *H01L 29/04* (2013.01); *H01L 29/0895* (2013.01); *H01L 29/267* (2013.01); *H01L 29/7376* (2013.01); *H01L 29/882* (2013.01); *H01L 21/0237* (2013.01); *H01L 21/0256* (2013.01); *H01L 21/02521* (2013.01); *H01L 21/02554* (2013.01); *H01L 21/02565* (2013.01); *H01L 21/02568* (2013.01);
(Continued)

(58) Field of Classification Search
CPC ........ H01L 27/11; H01L 27/24; H01L 29/122; H01L 29/882; H01L 29/7376
USPC ................................................. 257/427
See application file for complete search history.

(56) References Cited

U.S. PATENT DOCUMENTS

| 4,307,510 A | 12/1981 | Sawyer et al. |
| 4,322,253 A | 3/1982 | Pankove et al. |

(Continued)

FOREIGN PATENT DOCUMENTS

| CN | 2550906 | 5/2003 |
| DE | 10017137 | 10/2000 |

(Continued)

OTHER PUBLICATIONS

Kwok K. Ng, "Resonant-Tunneling Diode," Complete Guide to Semiconductor Devices, Chapter 10. Nov. 3, 2010, pp. 75-83.

(Continued)

*Primary Examiner* — Long K Tran
(74) *Attorney, Agent, or Firm* — Slater & Matsil, L.L.P.

(57) ABSTRACT

Structures include a tunneling device disposed over first and second lattice-mismatched semiconductor materials. Process embodiments include forming tunneling devices over lattice-mismatched materials.

20 Claims, 31 Drawing Sheets

(51) Int. Cl.

| | |
|---|---|
| *G11C 11/16* | (2006.01) |
| *H01L 27/11* | (2006.01) |
| *H01L 27/24* | (2006.01) |
| *H01L 29/737* | (2006.01) |
| *H01L 29/88* | (2006.01) |
| *H01L 29/04* | (2006.01) |
| *H01L 29/08* | (2006.01) |
| *H01L 29/267* | (2006.01) |
| *H01L 21/02* | (2006.01) |

(52) U.S. Cl.
CPC ........ *H01L 21/02636* (2013.01); *Y10S 438/979* (2013.01)

(56) References Cited

U.S. PATENT DOCUMENTS

| | | | |
|---|---|---|---|
| 4,370,510 A | 1/1983 | Stirn | |
| 4,545,109 A | 10/1985 | Reichert | |
| 4,551,394 A | 11/1985 | Betsch et al. | |
| 4,651,179 A | 3/1987 | Reichert | |
| 4,727,047 A | 2/1988 | Bozler et al. | |
| 4,774,205 A | 9/1988 | Choi et al. | |
| 4,789,643 A | 12/1988 | Kajikawa | |
| 4,826,784 A | 5/1989 | Salerno et al. | |
| 4,860,081 A | 8/1989 | Cogan | |
| 4,876,210 A | 10/1989 | Barnett et al. | |
| 4,948,456 A | 8/1990 | Schubert | |
| 4,963,508 A | 10/1990 | Umeno et al. | |
| 5,032,893 A | 7/1991 | Fitzgerald, Jr. et al. | |
| 5,034,337 A | 7/1991 | Mosher et al. | |
| 5,061,644 A | 10/1991 | Yue et al. | |
| 5,079,616 A | 1/1992 | Yacobi et al. | |
| 5,091,333 A | 2/1992 | Fan et al. | |
| 5,091,767 A | 2/1992 | Bean et al. | |
| 5,093,699 A | 3/1992 | Weichold et al. | |
| 5,098,850 A | 3/1992 | Nishida et al. | |
| 5,105,247 A | 4/1992 | Cavanaugh | |
| 5,108,947 A | 4/1992 | Demeester et al. | |
| 5,156,995 A | 10/1992 | Fitzgerald, Jr. et al. | |
| 5,159,413 A | 10/1992 | Calviello et al. | |
| 5,164,359 A | 11/1992 | Calviello et al. | |
| 5,166,767 A | 11/1992 | Kapoor et al. | |
| 5,223,043 A | 6/1993 | Olson et al. | |
| 5,236,546 A | 8/1993 | Mizutani | |
| 5,238,869 A | 8/1993 | Shichijo et al. | |
| 5,256,594 A | 10/1993 | Wu et al. | |
| 5,269,852 A | 12/1993 | Nishida | |
| 5,269,876 A | 12/1993 | Mizutani | |
| 5,272,105 A | 12/1993 | Yacobi et al. | |
| 5,281,283 A | 1/1994 | Tokunaga et al. | |
| 5,285,086 A | 2/1994 | Fitzgerald, Jr. | |
| 5,295,150 A | 3/1994 | Vangieson et al. | |
| 5,356,831 A | 10/1994 | Calviello et al. | |
| 5,403,751 A | 4/1995 | Nishida et al. | |
| 5,405,453 A | 4/1995 | Ho et al. | |
| 5,407,491 A | 4/1995 | Freundlich et al. | |
| 5,410,167 A | 4/1995 | Saito | |
| 5,417,180 A | 5/1995 | Nakamura | |
| 5,427,976 A | 6/1995 | Koh et al. | |
| 5,432,120 A | 7/1995 | Meister et al. | |
| 5,438,018 A | 8/1995 | Mori et al. | |
| 5,461,243 A | 10/1995 | Ek et al. | |
| 5,518,953 A | 5/1996 | Takasu | |
| 5,528,209 A | 6/1996 | MacDonald et al. | |
| 5,545,586 A | 8/1996 | Koh | |
| 5,548,129 A | 8/1996 | Kubena | |
| 5,589,696 A | 12/1996 | Baba | |
| 5,621,227 A | 4/1997 | Joshi | |
| 5,622,891 A | 4/1997 | Saito | |
| 5,640,022 A | 6/1997 | Inai | |
| 5,710,436 A | 1/1998 | Tanamoto et al. | |
| 5,717,709 A | 2/1998 | Sasaki et al. | |
| 5,792,679 A | 8/1998 | Nakato | |
| 5,825,049 A | 10/1998 | Simmons et al. | |
| 5,825,240 A | 10/1998 | Geis et al. | |
| 5,849,077 A | 12/1998 | Kenney | |
| 5,853,497 A | 12/1998 | Lillington et al. | |
| 5,869,845 A | 2/1999 | Vander Wagt et al. | |
| 5,883,549 A | 3/1999 | De Los Santos | |
| 5,886,385 A | 3/1999 | Arisumi et al. | |
| 5,903,170 A | 5/1999 | Kulkarni et al. | |
| 5,953,361 A | 9/1999 | Borchert et al. | |
| 5,959,308 A | 9/1999 | Shichijo et al. | |
| 5,966,620 A | 10/1999 | Sakaguchi et al. | |
| 5,998,781 A | 12/1999 | Vawter et al. | |
| 6,011,271 A | 1/2000 | Sakuma et al. | |
| 6,015,979 A | 1/2000 | Sugiura et al. | |
| 6,049,098 A | 4/2000 | Sato | |
| 6,083,598 A | 7/2000 | Ohkubo et al. | |
| 6,100,106 A | 8/2000 | Yamaguchi et al. | |
| 6,110,813 A | 8/2000 | Ota et al. | |
| 6,111,288 A | 8/2000 | Watanabe et al. | |
| 6,121,542 A | 9/2000 | Shiotsuka et al. | |
| 6,150,242 A | 11/2000 | Van de Wagt et al. | |
| 6,153,010 A | 11/2000 | Kiyoku et al. | |
| 6,191,432 B1 | 2/2001 | Sugiyama et al. | |
| 6,208,555 B1 | 3/2001 | Noble | |
| 6,225,650 B1 | 5/2001 | Tadatomo et al. | |
| 6,228,691 B1 | 5/2001 | Doyle | |
| 6,229,153 B1 | 5/2001 | Botez et al. | |
| 6,235,547 B1 | 5/2001 | Sakuma et al. | |
| 6,252,261 B1 | 6/2001 | Usui et al. | |
| 6,252,287 B1 | 6/2001 | Kurtz et al. | |
| 6,271,551 B1 | 8/2001 | Schmitz et al. | |
| 6,274,889 B1 | 8/2001 | Ota et al. | |
| 6,300,650 B1 | 10/2001 | Sato | |
| 6,320,220 B1 | 11/2001 | Watanabe et al. | |
| 6,325,850 B1 | 12/2001 | Beaumont et al. | |
| 6,339,232 B1 | 1/2002 | Takagi | |
| 6,342,404 B1 | 1/2002 | Shibata et al. | |
| 6,348,096 B1 | 2/2002 | Sunakawa et al. | |
| 6,352,942 B1 | 3/2002 | Luan et al. | |
| 6,362,071 B1 | 3/2002 | Nguyen et al. | |
| 6,380,051 B1 | 4/2002 | Yuasa et al. | |
| 6,380,590 B1 | 4/2002 | Yu | |
| 6,403,451 B1 | 6/2002 | Linthicum et al. | |
| 6,407,425 B1 | 6/2002 | Babcock et al. | |
| 6,456,214 B1 | 9/2002 | van de Wagt | |
| 6,458,614 B1 | 10/2002 | Nanishi et al. | |
| 6,475,869 B1 | 11/2002 | Yu | |
| 6,492,216 B1 | 12/2002 | Yeo et al. | |
| 6,500,257 B1 | 12/2002 | Wang et al. | |
| 6,503,610 B2 | 1/2003 | Hiramatsu et al. | |
| 6,512,252 B1 | 1/2003 | Takagi et al. | |
| 6,521,514 B1 | 2/2003 | Gehrke et al. | |
| 6,552,259 B1 | 4/2003 | Hosomi et al. | |
| 6,566,284 B2 | 5/2003 | Thomas, III et al. | |
| 6,576,532 B1 | 6/2003 | Jones et al. | |
| 6,579,463 B1 | 6/2003 | Winningham et al. | |
| 6,603,172 B1 | 8/2003 | Segawa et al. | |
| 6,606,335 B1 | 8/2003 | Kuramata et al. | |
| 6,617,643 B1 | 9/2003 | Goodwin-Johansson | |
| 6,635,110 B1 | 10/2003 | Luan et al. | |
| 6,645,295 B1 | 11/2003 | Koike et al. | |
| 6,645,797 B1 | 11/2003 | Buynoski et al. | |
| 6,686,245 B1 | 2/2004 | Mathew et al. | |
| 6,703,253 B2 | 3/2004 | Koide | |
| 6,709,982 B1 | 3/2004 | Buynoski et al. | |
| 6,710,368 B2 | 3/2004 | Fisher et al. | |
| 6,720,196 B2 | 4/2004 | Kunisato et al. | |
| 6,727,523 B2 | 4/2004 | Morita | |
| 6,753,555 B2 | 6/2004 | Takagi et al. | |
| 6,756,611 B2 | 6/2004 | Kiyoku et al. | |
| 6,762,483 B1 | 7/2004 | Krivokapic et al. | |
| 6,767,793 B2 | 7/2004 | Clark et al. | |
| 6,784,074 B2 | 8/2004 | Shchukin et al. | |
| 6,787,864 B2 | 9/2004 | Paton et al. | |
| 6,794,718 B2 | 9/2004 | Nowak et al. | |
| 6,800,910 B2 | 10/2004 | Lin et al. | |
| 6,803,598 B1 | 10/2004 | Berger et al. | |
| 6,809,351 B2 | 10/2004 | Kuramoto et al. | |
| 6,812,053 B1 | 11/2004 | Kong et al. | |
| 6,812,495 B2 | 11/2004 | Wada et al. | |

(56) References Cited

U.S. PATENT DOCUMENTS

| | | |
|---|---|---|
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |

(56) References Cited

U.S. PATENT DOCUMENTS

| | | |
|---|---|---|
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0252861 A1 | 10/2010 | Lochtefeld |
| 2010/0308376 A1 | 12/2010 | Takada et al. |
| 2011/0011438 A1 | 1/2011 | Li |
| 2011/0049568 A1 | 3/2011 | Lochtefeld et al. |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |

(56) References Cited

FOREIGN PATENT DOCUMENTS

| | | |
|---|---|---|
| JP | 11307868 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2009177167 | 8/2009 |
| KR | 20030065631 | 8/2003 |
| KR | 20090010284 | 1/2009 |
| TW | 544930 | 8/2003 |
| WO | WO0072383 | 11/2000 |
| WO | WO0101465 | 1/2001 |
| WO | WO0209187 | 1/2002 |
| WO | WO02086952 | 10/2002 |
| WO | WO02088834 | 11/2002 |
| WO | WO03073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2008124154 | 10/2008 |

OTHER PUBLICATIONS

"Communication pursuant to Article 94(3) EPC," Application No. 06 770 525.1-2203, Applicant: Taiwan Semiconductor Company, Ltd., Feb. 17, 2011, 4 pages.
68 Applied Physics Letters 7, 1999, pp. 774-779 (trans. of relevant portions attached).
Ames, "Intel Says More Efficient Chips are Coming," PC World, available at: http://www.pcworld.com/printable/article/id,126044/printable.html (Jun. 12, 2006); 4 pages.
Asano et al., "AlGaInN laser diodes grown on an ELO-GaN substrate vs. on a sapphire substrate," Semiconductor Laser Conference (2000) Conference Digest, IEEE 17th International, 2000, pp. 109-110.
Asaoka, et al., "Observation of 1 f γnoise of GaInP/GaAs triple barrier resonant tunneling diodes, " AIP Conf. Proc., vol. 780, Issue 1, 2005, pp. 492-495.
Ashby, et al., "Low-dislocation-density GaN from a single growth on a textured substrate," Applied Physics Letters, vol. 77, No. 20, Nov. 13, 2000, pp. 3233-3235.
Ashley, et al., "Heternogeneous InSb Quantum Well Transistors on Silicon for Ultra-High Speed, Low Power Logic Applications," 43 Electronics Letters 14, Jul. 2007, 2 pages.
Bai et al., "Study of the Defect Elimination Mechanisms in Aspect Ratio Trapping Ge Growth," Applied Physics Letters, vol. 90, 2007, 3 pages.
Bakkers et al., "Epitaxial Growth on InP Nanowires on Germanium," Nature Materials, vol. 3, Nov. 2004, pp. 769-773.
Baron et al., "Chemical Vapor Deposition of Ge Nanocrystals on $SiO_2$," Applied Physics Letters, vol. 83, No. 7, Aug. 18, 2003, pp. 1444-1446.
Bean at al., "$Ge_xSi_{1-x}$/Si strained-later Superlattice grown by molecular beam Epitaxy," Journal of Vacuum Science Technology A2 (2), Jun. 1984, pp. 436-440.
Beckett at al., "Towards a reconfigurable nanocomputer platform," ACM International Conference Proceeding Series, vol. 19, 2002, pp. 141-150.
Beltz et al., "A Theoretical Model for Threading Dislocation Reduction During Selective Area Growth," Materials Science and Engineering, A234-236, 1997, pp. 794-797.
Belyaev, et al., "Resonance and current instabilities in AlN/GaN resonant tunneling diodes," 21 Physica E 2-4, 2004, pp. 752-755.
Berg, J., "Electrical Characterization of Silicon Nanogaps," Doktorsavhandlingar vid Chalmers Tekniska Hagskola, 2005, No. 2355, 2 pages.
Bergman at al., "RTD/CMOS Nanoelectronic Circuits: Thin-Film InP-based Resonant Tunneling Diodes Integrated with CMOS circuits," 20 Electron Device Letters 3, 1999, pp. 119-122.
Blakeslee, "The Use of Superlattices to Block the Propagation of Dislocations in Semiconductors," Mat. Res. Soc. Symposium Proceedings 148, 1989, pp. 217-227.
Bogumilowicz at al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.
Borland, "Novel Device structures by selective epitaxial growth (SEG)," Electron Devices Meeting, vol. 33, 1987, pp. 12-15.
Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.
Burenkov et al., "Corner Effect in Double and Triple Gate FinFETs "European solid-state device research, 33rd Conference on Essderc '03 Sep. 16-18, 2003, Piscataway, NJ, USA, IEEE, vol. 16, pp. 135-38, XPo10676716.
Bushroa et al., "Lateral epitaxial overgrowth and reduction in defect density of 3C-SiC on patterned Si substrates," Journal of Crystal Growth, vol. 271, No. 1-2, Oct. 15, 2004, pp. 200-206.
Calado, et al., "Modeling of a resonant tunneling diode optical modulator," University of Algarve, Department of Electronics and Electrical Engineering, 2005, pp. 96-99.
Campo et al., "Comparison of Etching Processes of Silicon and Germanium in SF6-O2 Radio-Frequency Plasma," 13 Journal of Vac. Sci. Tech., B-2, 1995, pp. 235-241.
Cannon et al., "Monolithic Si-based Technology for Optical Receiver Circuits," Proceedings of SPIE, vol. 4999, 2003, pp. 145-155.
Chan et al., "Influence of Metalorganic Sources on the Composition Uniformity of Selectively Grown $Ga_xIn_{1-x}P$," Japan Journal of Applied Physics, vol. 33, 1994, pp. 4812-4819.
Chang et al. "3-D simulation of strained Si/SiGe heterojunction FinFETs" Semiconductor Device Research Symposium, Dec. 10-12, 2003, pp. 176-177.
Chang et al., "Effect of growth temperature on epitaxial lateral overgrowth of GaAs on Si substrate," Journal of Crystal Growth, vol. 174, No. 1-4, Apr. 1997, pp. 630-634.
Chang et al., "Epitaxial Lateral Overgrowth of Wide Dislocation-Free GaAs on Si Substrates," Electrochemical Society Proceedings, vol. 97-21, May 13, 1998, pp. 196-200.
Chau et al., Opportunities and Challenges of III-V Nanoelectronics for Future High-Speed, Low Power Logic Applications, IEEE CSIC Digest, 2005, pp. 17-20.
Chen et al., "Dislocation reduction in GaN thin films via lateral overgrowth from trenches," Applied Physics Letters, vol. 75, No. 14, Oct. 4, 1999, pp. 2062-2063.
Chengrong, et al., "DBRTD with a high PVCR and a peak current density at room temperature," Chinese Journal of Semiconductors vol. 26, No. 10, Oct. 2005, pp. 1871-1874.
Choi et al., "Monolithic Integration GaAs/AlGaAs LED and Si Driver Circuit," 9 Electron Device Letters 10, Oct. 1988, 3 pages.
Choi et al., "Monolithic Integration of GaAs/AlGaA5 Double-Heterostructure LEDs and Si MOSFETs," Electron Device Letters, vol. EDL-7, No. 9, Sep. 1986, 3 pages.
Choi et al., "Monolithic Integration of Si MOSFETs and GaAs MESFETs," Electron Device Letters, vol. EDL-7, No. 4, Apr. 1966, 3 pages.
Choi, et al., "Low-voltage low-power K-band balanced RTD-based MMIC VCO," 2006 IEEE, Department of EECS, Korea Advanced Institute of Science and Technology, 2006, pp. 743-746.
Cloutier et al., "Optical gain and stimulated emission in periodic nanopatterned crystalline silicon," Nature Materials, Nov. 2005, 5 pages.

(56) References Cited

OTHER PUBLICATIONS

Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.
Dadgar et al., "MOVPE growth of GaN on Si (111) substrates," Journal of Crystal Growth, vol. 248, Feb. 1, 2003, pp. 556-562.
Datta et al., "Silicon and III-V Nanoelectronics," IEEE International Conference on Indium Phosphide & Related Materials, 2005, pp. 7-8.
Datta et al., "Ultrahigh-Speed 0.5 V Supply Voltage In0.7Ga0.3As Quantum-Well Transistors on Silicon Substrate," 28 Electron Device Letters B, 2007, pp. 685-687.
Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.
De Boeck et al., "The fabrication on a novel composite $GaAs/SiO_2$ nucleation layer on silicon for heteroepitaxial overgrowth by molecular beam Epitaxy," Material Science and Engineering, B9, 1991, pp. 137-141.
Donaton et al., "Design and Fabrication of MOSFETs with a Reverse Embedded SiGe (Rev. e-SiGe) Structure," 2006 IEDM, pp. 465-468.
Dong, Y., et al, "Selective area growth of InP through narrow openings by MOCVD and its application to InP HBT," 2003 International Conference on Indium Phosphide and Related Materials, May 12-16, 2003, pp. 389-392.
European Patent Office, Extended European Search Report and Search Opinion dated Jan. 26, 2011 in EP Patent Application No. 10003084.0-2203 (9 pages).
European Search Report issued by the European Patent Office on Dec. 15, 2010 in European Patent Application No. 10002884.4 (10 pages).
Examination Report in European Patent Application No. 06800414.2, mailed Mar. 5, 2009, 3 pages.
Fang et al., "Electrically pumped hybrid AlGaInAs-silicon evanescent laser," 14 Optics Express 20, 2006, pp. 9203-9210.
Feltin et al., "Epitaxial lateral overgrowth of GaN on Si (111)," Journal of Applied Physics, vol. 93, No. 1, Jan. 1, 2003, pp. 182-185.
Feng et al., "Integration of Germanium-on Insulator and Silicon Substrate," 27 Electron Device Letters 11, 2006, pp. 911-913.
Fiorenza et al., "Film Thickness Constraints for Manufacturable Strained Silicon Cmos," 19 Semiconductor Science Technology, 2004, p. L4.
Fischer et al., "Elastic stress relaxation in SiGe epilayers on patterned Si substrates," 75 Journal of Applied Physics 1, 1994, pp. 657-659.
Fischer et al., "State of stress and critical thickness of Strained small-area SiGe layers," Phys. Stat. Sol. (a) vol. 171, 1999, pp. 475-485.
Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9, 1990, pp. 949-955.
Fitzgerald et al., "Epitaxial Necking in GaAs Growth on Pre-patterned Si Substrates," Journal of Electronic Materials, vol. 20, No. 10, 1991, pp. 839-853.
Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.
Fitzgerald et al., "Structure and recombination in InGaAs/GaAs heterostructures," 63 Journal of Applied Physics, vol. 3, 1988, pp. 693-703.
Fitzgerald et al., "Totally relaxed $Ge_xSi_{1-x}$ layers with low threading dislocation densities grown on Si Substrates," vol. 59, Applied Physics Letters 7, 1991, pp. 811-813.
Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.
Gallagher et al., "Development of the magnetic tunnel junction MRAM at IBM: From first junctions to a 16-Mb MRAM demonstrator chip," 50 IBM J. Research & Dev. 1, Jan. 2006, pp. 5-23A.
Gallas et al., "Influence of Doping on Facet Formation at the $SiO_2/Si$ Interface," Surface Sci. 440, 1999, pp. 41-48.

Geppert, "Quantum transistors: toward nanoelectronics," IEEE Spectrum, Sep. 2000, pp. 46-51.
Gibbon et al., "Selective-area low-pressure MOCVD of GaInAsP and related materials on planar InP substrates," Semicond. Sci. Tech. vol. 8, 1993, pp. 998-1010.
Glew et al., "New DFB grating structure using dopant-induced refractive index step," J. Crystal Growth 261, 2004, pp. 349-354.
Golka, et al., "Negative differential resistance in dislocation-free GaN/AlGan double-barrier diodes grown on bulk GaN," 88 Applied Physics Letters 17, Apr. 2006, pp. 172106-1-172106-3.
Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.
Gould et al., "Magnetic resonant tunneling diodes as voltage-controlled spin selectors," 241 Phys. Stat. Sol. (B), vol. 3, 2004, pp. 700-703.
Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.
Gruber, et al., "Semimagnetic Resonant Tunneling Diodes for Electron Spin Manipulation," Nanostructures: Physics & Technology, 8th International Symposium, 2000, pp. 483-486.
Gustafsson et al., "Cathodoluminescence from relaxed $Ge_xSi_{1-x}$ grown by heteroepitaxial lateral overgrowth," Journal of Crystal Growth 141, 1994, pp. 363-370.
Gustafsson et al., "Investigations of high quality $Ge_xSi_{1-x}$ grown by heteroepitaxial lateral overgrowth using cathodoluminescence," Inst. Phys. Conf. Ser., No. 134, Section 11, Apr. 1993, pp. 675-678.
Hammerschmidt, "Intel to Use Trigate Transistors from 2009 on," EETIMES Online, available at: http://www.eetimes.com/showArticle.jhtml?articleID=189400035 (Jun. 12, 2006). 1 page.
Hasegawa, et al., "Sensing Terahertz Signals with III-V Quantum Nanostructures," Quantum Sensing: Evolution and Revolution from Past to Future, SPIE 2003, pp. 96-105.
Hayafuji et al., Japan, Journal of Applied Physics, vol. 29, 1990, pp. 2371.
Hersee et al., "The Controlled Growth of GaN Nanowires," Nano Letters, vol. 6, No. 8, 2006, pp. 1808-1811.
Hiramatsu et al., "Fabrication and characterization of low defect density GaN using facet-controlled epitaxial lateral overgrowth (FACELO)," Journal of Crystal Growth, vol. 221, Dec. 2000, pp. 316-326.
Hollander et al., "Strain and Misfit Dislocation Density in Finite Lateral Size $Si_{1-x}Ge_x/Si$ Films Grown by Selective Epitaxy," Thin Solid Films, vol. 292, 1997, pp. 213-217.
Hu et al., "Growth of Well-Aligned Carbon Nanotube arrays on Silicon Substrates Using Porous Alumina Film as a Nanotemplate," 79 Applied Physics Letters 19, 2001, 3 pages.
Yanlong, et al., "Monolithically fabricated OEICs using RTD and MSM," Chinese Journal Semiconductors vol. 27, No. 4, Apr. 2006, pp. 641-645.
Huang et al., "Electron and Hole Mobility Enhancement in Strained SOI by Wafer Bonding," 49 IEEE Transactions on Electron Devices 9, 2002, pp. 1566-1570.
Ying-Long, et al., "Resonant tunneling diodes and high electron mobility transistors integrated on GaAs substrates," Chinese Physics Letters 23, vol. 3, Mar. 2006, pp. 697-700.
Hydrick et al., "Chemical Mechanical Polishing of Epitaxial Germanium on $SiO_2$-patterned Si(001) Substrates," ECS Transactions, 16 (10), 2008, (pp. 237-248).
Intel Press Release, "Intel's Tri-Gate Transistor to Enable Next Era in Energy-Efficient Performance," Intel Corporation (Jun. 12, 2006). 2 pages.
Intel to Develop Tri-Gate Transistors Based Processors, available at: http://news.techwhack.com/3822/tri-gate-transistors/ (Jun. 13, 2006) 6 pages.
International Preliminary Report on Patentability for International Application No. PCT/US2006/019152 mailed Nov. 29, 2007, 2 pages.

(56) References Cited

OTHER PUBLICATIONS

International Preliminary Report on Patentability for International Application No. PCT/US2006/029247 mailed Feb. 7, 2008, 12 pages.
International Preliminary Report on Patentability for International Application No. PCT/US2006/033859 mailed Mar. 20, 2006, 14 pages.
International Preliminary Report on Patentability for International Application No. PCT/US2007/019568 mailed Mar. 19, 2009, 10 pages.
International Preliminary Report on Patentability for International Application No. PCT/US2007/020181 mailed Apr. 2, 2009, 9 pages.
International Preliminary Report on Patentability for International Application No. PCT/US2007/020777 mailed Apr. 9, 2009, 12 pages.
International Preliminary Report on Patentability for International Application No. PCT/US2007/021023 mailed Apr. 9, 2009, 8 pages.
International Preliminary Report on Patentability for International Application No. PCT/US2007/022392 mailed Apr. 30, 2009, 14 pages.
International Search Report and Written Opinion for International Application No. PCT/US2006/019152 mailed Oct. 19, 2006, 11 pages.
International Search Report and Written Opinion for International Application No. PCT/US2006/029247 mailed May 7, 2007, 19 pages.
International Search Report and Written Opinion for International Application No. PCT/US2008/068377, mailed Jul. 6, 2009, 19 pages.
International Search Report and Written Opinion for International Application No. PCT/US2006/033859 mailed Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 mailed Feb. 6, 2008, 13 pages.
International Search Report and Written Opinion for International Application No. PCT/US2007/020181 mailed Jan. 25, 2008, 15 pages.
International Search Report and Written Opinion for International Application No. PCT/US2007/020777 mailed Feb. 8, 2008, 18 pages.
International Search Report and Written Opinion for International Application No. PCT/US2007/021023 mailed Jun. 6, 2008, 10 pages.
International Search Report and Written Opinion for International Application No. PCT/US2007/022392 mailed Apr. 11, 2008, 20 pages.
International Search Report for International Application No. PCT/US2006/019152, mailed May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988 pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.

Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Deposition of $Si_{1-x}Ge_x$," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physics Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-70.
Kim et al., "Silicon-Based Field-Induced Band-to-Band Tunneling Effect Transistor," IEEE Electron Device Letters, No. 25, No. 6, 2004, pp. 439-441.
Kim et al., "GaN nano epitaxial lateral overgrowth on holographically patterned substrates," School of Physics and Inter-University Semiconductor Research Center, Seoul National University, Aug. 25-27, 2003, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.
Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.
Kollonitsch, et al., "Improved Structure and Performance of the GaAsSb/InP Interface in a Resonant Tunneling Diode," Journal of Crystal Growth, vol. 267, 2006, pp. 536-540.
Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9 pages.
Krost et al., "GaN-based Optoelectronics on Silicon Substrates," Materials Science & Engineering, B93, 2002, pp. 77-84.
Sudirgo et al., "Si-Based Resonant Interband Tunnel Diode/CMOS Integrated Memory Circuits," Rochester Institute of Technology, IEEE, 2006, pp. 109-112.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.
Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.
Kwok, "Barrier-Injection Transit Time Diode," Complete Guide to Semiconductor Devices, $2^{nd}$ ed., Chapter 18, 2002, pp. 137-144.
Lammers, "Trigate and High-k stack up vs. planar," EETIMES Online, available at: http://www.eetimes.com/showArticle. jhtml?articleID=188703323&pgno=2&printable=true (Jun. 12, 2006). 2 pages.
Langdo et al., "High Quality Ge on Si by Epitaxial Necking," Applied Physics Letters, vol. 76, No. 25, Jun. 19, 2000, pp. 3700-3702.
Langdo, "Selective SiGe Nanostructures," PhD Thesis, Massachusetts Institute of Technology, Jun. 2001, 215 pages.
Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.

(56) References Cited

OTHER PUBLICATIONS

Lee et al., "Strain-relieved, Dislocation-free In$_x$Ga$_{1-x}$As/GaAs(001) Heterostructure by Nanoscale-patterned Growth," Applied Physics Letters, vol. 85, No. 18, Nov. 1, 2004, pp. 4181-4183.

Li et al., "Defect Reduction of GasAs Epitaxy on Si (001) Using Selective Aspect Ratio Trapping," 91 Applied Physics Letters, 2007, pp. 021114-1-021114-3.

Li et al., "Heteroepitaxy of High-quality Ge on Si by Nanoscale Ge seeds Grown through a Thin Layer of SiO$_2$," Applied Physics Letters, vol. 85, No. 11, Sep. 13, 2004, pp. 1928-1930.

Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.

Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.

Li et al., "Selective Growth of Ge on Si (100) through Vias of Sio2Nanotemplate Using Solid Source Molecular Beam Epitaxy," Applied Physics Letters, vol. 83, No. 24, Dec. 15, 2003, pp. 5032-5034.

Liang et al., "Critical Thickness enhancement of Epitaxial SiGe films Grown on Small Structures," Journal of Applied Physics, vol. 97, 2005, pp. 043519-1-043519-7.

Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.

Liu et al., "High Quality Single-crystal Ge on Insulator by Liquid-phase Epitaxy on Si Substrates," Applied Physics Letters, vol. 84, No. 14, Apr. 4, 2004, pp. 2563-2565.

Liu et al., "Rapid Melt Growth of Germanium Crystals with Self Aligned Microcrucibles on Si Substrates," Journal of the Electrochemical Society, vol. 152, No. 8, 2005, pp. G688-G693.

Loo et al., "Successful Selective Epitaxial Si$_{1-x}$Ge$_x$ Deposition Process for HBT-BiCMOS and High Mobility Heterojunction pMOS Applications," 150 Journal of Electrochemical Society 10, 2003, pp. G638-G647.

Lourdudoss et al., "Semi-insulating epitaxial layers for optoelectronic devices," Semiconducting and Insulating Materials Conference, SIMC-XI, 2000, pp. 171-178.

Luan et al., "High-quality Ge Epilayers on Si with Low Threading-dislocation Densities," Applied Physics Letters, vol. 75, No. 19, Nov. 8, 1999, pp. 2909-2911.

Luan, "Ge Photodetectors for Si Microphotonics," PhD Thesis, Massachusetts Institute of Technology, Department of Materials Science & Engineering, Jan. 12, 2001, 155 pages.

Lubnow et al., "Effect of III/V-Compound Epitaxy on Si Metal-Oxide-Semiconductor Circuits," Japan, Journal of Applied Physics, vol. 33, 1994, pp. 3628-3634.

Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.

Luryi et al., "New Approach to the High Quality Epitaxial Growth of Latticed-Mismatched Materials," Applied Physics Letters, vol. 49, No. 3, Jul. 21, 1986, pp. 140-142.

Ma, et al., "A small signal equivalent circuit model for resonant tunneling diode," Chinese Physics Letters, vol. 23, No. 8, Aug. 2006, pp. 2292-2295.

Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.

Maekawa, et al., "High PVCR Si/Si1-x/Gex DW RTD formed with a new triple-layer buffer," Materials Science in Semiconductor Processing, vol. 8, 2005, pp. 417-421.

Maezawa, et al., "Metamorphic resonant tunneling diodes and its application to chaos generator ICs, "44 Jap. J. Applied Physics, Part 1, No. 7A, Jul. 2005, pp. 4790-4794.

Maezawa, et al., "InP-based resonant tunneling diode/HEMT integrated circuits for ultrahigh-speed operation," IEEE Nagoya University, Institute for Advanced Research, 2006, pp. 252-257.

Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.

Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.

Matthews et al., "Defects in Epitaxial Multilayers- Misfit Dislocations," Journal of Crystal Growth, vol. 27, 1974, pp. 118-125.

Monroy, et al., "High UV/visible Contrast Photodiodes Based on Epitaxial Lateral Overgrown GaN layers," Electronics Letters, vol. 35, No. 17, Aug. 19, 1999, pp. 1488-1489.

Nakano et al., "Epitaxial Lateral Overgrowth of AlN Layers on Patterned Sapphire Substrates," Source: Physics Status Solidi A, vol. 203, No. 7, May 2006, pp. 1632-1635.

Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.

Naoi et al., "Epitaxial Lateral Overgrowth of GaN on Selected-area Si (111) Substrate with Nitrided Si Mask," Journal of Crystal Growth, vol. 248, 2003, pp. 573-577.

Naritsuka et al., "InP Layer Grown on (001) Silicon Substrate by Epitaxial Lateral Overgrowth," Japan, Journal of Applied Physics, vol. 34, 1995, pp. L1432-L1435.

Naritsuka et al., "Vertical Cavity Surface Emitting Laser Fabricated on GaAs Laterally Grown on Si Substrate," Electrochemical Society Proceedings, vol. 97, No. 21, pp. 86-90.

Neudeck, et al., "Novel silicon Epitaxy for advanced MOSFET devices," Electron Devices Meeting, IEDM Technical Digest International, 2000, pp. 169-172.

Neumann et al., "Growth of III-V Resonant Tunneling Diode on Si Substrate with LP-MOVPE," Journal of Crystal Growth, vol. 248, 2003, pp. 380-383.

Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.

Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.

Noda, et al., "Current-voltage characteristics in double-barrier resonant tunneling diodes with embedded GaAs quantum rings," Physics E 32, 2006, pp. 550-553.

Norman, et al., "Characterization of MOCVD Lateral Epitaxial Overgrown III-V Semiconductor Layers on GaAs Substrates," Compound Semiconductors, Aug. 25-27, 2003, pp. 45-46.

Notification of Transmittal of the International Search Report and the Written Opinion of the International Searching Authority for PCT/US2010/029552, Applicant: Taiwan Semiconductor Manufacturing Company, Ltd., May 26, 2010, 14 pages.

Oehrlein et al., "Studies of the Reactive Ion Etching of SiGe Alloys," J. Vac. Sci. Tech, A9, No. 3, May/Jun. 1991, pp. 768-774.

Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.

Parillaud et al., "High Quality InP on Si by Conformal Growth," Applied Physics Letters, vol. 68, No. 19, May 6, 1996, pp. 2654-2656.

Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.

Park et al., "Defect Reduction of Selective Ge Epitaxy in Trenches on Si (001) Substrates Using Aspect Ratio Trapping," Applied Physics Letters 90, 052113, Feb. 2, 2007, 3 pages.

Park et al., "Fabrication of Low-Defectivity, Compressively Strained Geon Si$_{0.2}$G$^e{}_{0.8}$ Structures Using Aspect Ratio Trapping," Journal of the Electrochemical Society, vol. 156, No. 4, 2009, pp. H249-H254.

Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.

(56) References Cited

OTHER PUBLICATIONS

Partial International Search for International Application No. PCT/US2006/033859 mailed Jun. 22, 2007, 7 pages.
Partial International Search Report for International Application No. PCT/US200B/004564 completed Jul. 22, 2009, mailed Oct. 16, 2009, 5 pages.
Partial International Search Report for International Application No. PCT/US2008/068377, completed Mar. 19, 2008, mailed Apr. 22, 2008, 3 pages.
PCT International Search Report of PCT/US2009/057493, from PCT/ISA/210, mailed Mar. 22, 2010, Applicant: Amberwave System Corporation et al., 2 pages.
Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-11901-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits, Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l. SOI Conf., pp. 110-111.
Suhara, et al, "Characterization of argon fast atom beam source and its application to the fabrication of resonant tunneling diodes," 2005 International Microprocesses and Nanotechnology Conf. Di. Of Papers, 2005, pp. 132-133.
Sun et al., Electron resonant tunneling through InAs/GaAs quantum dots embedded in a Schottky diode with an AIAs insertion layer, 153 J. Electrochemical Society 153, 2006, pp. G703-G706.
Sun et al., "Room-temperature observation of electron resonant tunneling through InAs/AIAs quantum dots," 9 Electrochemical and Solid-State Letters 5, May 2006, pp. G167-G170.
Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.
Sun et al., "Selective Area Growth of InP on InP Precoated Silicon Substrate by Hydride Vapor Phase epitaxy," Indium Phosphide and Related Materials Conference, IPRM. $14^{th}$, 2002, pp. 339-342.
Sun et al., "Sulfur Doped Indium Phosphide on Silicon Substrate Grown by Epitaxial Lateral Overgrowth," Indium Phosphide and Related Materials $16^{th}$ IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan at al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint $30^{th}$ International Conference on Infrared and Millimeter Waves & $13^{th}$ International Conference on Terahertz Electronics, 2005, pp. 150-151.
Takasuka et al., "AlGaAs/InGaAs DFB Laser by One-Time Selective MOCVD Growth on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SSOI) PMOS with Different Channel Orientations," IEEE, 2005, pp. 1-4.

(56) References Cited

OTHER PUBLICATIONS

Thelander, et al., "Heterostructures incorporated in one-dimensional semiconductor materials and devices," Physics of Semiconductors, vol. 171, 2002, 1 page. Abstract Only.
Thompson at al., "A Logic Nanotechnology Featuring Strained-Silicon," 25 IEEE Electron Device Letters 4, 2004, pp. 191-193.
Tomiya et al., "Dislocation Related Issues in the Degradation of GaN-Based Laser Diodes," Selected Topics in Quantum.Electronics, IEEE Journal of Selected Topics in Quantum Electronics, vol. 10, No. 6, Nov./Dec. 2004, pp. 1277-1286.
Tomiya, "Dependency of crystallographic tilt and defect distribution of mask material in epitaxial lateral overgrown GaN layers," Applied Physics Letters vol. 77, No. 5, pp. 636-638.
Tran et al., "Growth and Characterization of InP on Silicon by MOCVD," Journal of Crystal Growth, vol. 121, 1992, pp. 365-372.
Tsai, et al., "InP/InGaAs resonant tunneling diode with six-route negative differential resistances," 13th European Gallium Arsenide and other Compound Semiconductors Application Symp., 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.
Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.
Ujiie, et al., Epitaxial Lateral Overgrowth of GaAs on a Si Substrate, 28, Japan, Journal of Applied Physics, vol. 3, Mar. 1989, pp. L337-L339.
Usuda at al., "Strain Relaxation of Strained-Si Layers on SiGe-on-Insulator (SGOI) Structures After Mesa Isolation," Applied Surface Science, vol. 224, 2004, pp. 113-116.
Usui at al., "Thick GaN Epitaxial Growth with Low Dislocation Density by Hydride Vapor Phase Epitaxy," vol. 36, Japan, Journal of Applied Physics, 1997, pp. L899-L902.
Vanamu et al., "Epitaxial Growth of High-Quality Ge Films on Nanostructured Silicon Substrates," Applied Physics Letters, vol. 88, 2006, pp. 204104.1-204-104.3.
Vanamu et al., "Growth of High Quality Ge/$Si_{1-x}Ge_x$ on Nano-scale Patterned Si Structures," J. Vac. Sci. Technology. B, vol. 23, No. 4, Jul./Aug. 2005, pp. 1622-1629.
Vanamu at al., "Heteroepitaxial Growth on Microscale Patterned Silicon Structures," Journal of Crystal Growth, vol. 280, 2005, pp. 66-74.
Vanamu et al., "Improving Ge $Si_xGe_{1-x}$ Film Quality through Growth onto Patterned Silicon Substrates," Advances in Electronics Manufacturing, Nov. 8, 2004, pp. 1-4.
Vescan et al., "Lateral Confinement by Low Pressure Chemical Vapor Deposition-Based Selective Epitaxial Growth of $Si_{1-x}Ge_x$/Si Nanostructures," No. 81, Journal of Applied Physics 10, 1997, pp. 6709-6715.
Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.
Walker, et al., "Magnetotunneling spectroscopy of ring-shaped (InGa)As quantum dots: Evidence of excited states with 2pz character," 32 Physica E 1-2, May 2006, pp. 57-60.
Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.
Ting, et al., "Modeling Spin-Dependent Transport in InAS/GaSb/AlSb Resonant Tunneling Structures," 1 J. Computational Electronics, 2002, pp. 147-151.
Watanabe, et al., "Fluoride resonant tunneling diodes on Si substrates," IEEE International Semiconductor Device Research Symp. Dec. 2005, pp. 177-178.
Wernersson et al., "InAs Epitaxial Lateral Growth of W Marks," Journal of Crystal Growth, vol. 280, 2005, pp. 81-86.
Williams et al., "Etch Rates for Micromachining Processing—Part II," Journal of Microelectromechanical Systems, vol. 4, 1996, pp. 761-778.
Williams et al., "Etch Rates for Micromachining Processing—Part II," Journal of Microelectromechnical Systems, vol. 5, No. 4, Dec. 1996, pp. 256-269.
Wu et al., "Enhancement-mode InP n-channel metal-oxide-semiconductor field-effect-transistors with atomic-layer-deposited Al2O3 dielectrics," Applied Physics Letters 91, 022108-022110 (2007).
Wu et al., Gross-Sectional Scanning/Tunneling Microscopy Investigations of Cleaned III-V Heterostructures, Technical report, Dec. 1996, 7 pages.
Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.
Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-161105-3.
Xie et al., "From Porous Si to Patterned Si Substrate: Can Misfit Strain Energy in a Continuous Heteropitaxial Film Be Reduced?" Journal of Vacuum Science Technology, B, vol. 8, No. 2, Mar./Apr. 1990, pp. 227-231.
Xu et al., "Spin-Filter Devices Based on Resonant Tunneling Antisymmetrical Magnetic Semiconductor Hybrid Structures," vol. 84, Applied Physics Letters 11, 2004, pp. 1955-1957.
Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.
Yamaguchi et al., "Defect Reduction Effects in GaAs on Si Substrates by Thermal Annealing," Applied Physics Letters vol. 53, No. 23, 1998, pp. 2293.
Yamaguchi et al., GaAs Solar Cells Grown on Si Substrates for Space Use: Prog. Photovolt.: Res. Appl., vol. 9, 2001; pp. 191-201.
Yamaguchi et al., "Super-High-Efficiency Multi-junction Solar Cells," Prog. Photovolt.: Res. Appl., vol. 13, 2005, pp. 125-132.
Yamamoto et al., "Optimization of InP/Si Heteroepitaxial Growth Conditions Using Organometallic Vapor Phase.Epitaxy," Journal of Crystal Growth, vol. 96, 1989, pp. 369-377.
Yang et al., "High Performance Cmos Fabricated on Hybrid Substrate with Different Crystal Orientations," IEDM Tech. Dig., 2003, pp. 453-456.
Yang et al., "Selective Area Deposited Blue GaN-InGaN Multiple-quantum Well Light Emitting Diodes over Silicon Substrates," Applied Physics Letter, vol. 76, No. 3, Jan. 17, 2000, pp. 273-275.
Yili, et al., "Physics-based hydrodynamic simulation of direct current characteristics in DBRTD," 29 Chinese J. Electron Devices 2, Jun. 2006, pp. 365-368.
Yin et al., "Ultrathin Strained-SOI by Stress Balance on Compliant Substrates and FET Performance," 52 IEEE Trans.On Electron Devices 10, 2005, pp. 2207-2214.
Dong et al., "Selective area growth of InP through narrow openings by MOCVD and its application to inP HBT," Indium Phosphide and Related Materials, International Conference, May 12-16, 2003, pp. 389-392.
Yoon et al., "Selective Growth of Ge Islands on Nanometer-scale Patterned $SiO_2$/Si Substrate by Molecular Beam Epitaxy," Applied Physics Letters, vol. 89, 2006, pp. 063107.1-063107.3.
Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.
Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.

(56) References Cited

OTHER PUBLICATIONS

Zang et al., "Nanoheteroepitaxial lateral overgrowth of GaN on nanoporous Si (111)," Applied Physics Letters, vol. 88, No. 14, Apr. 3, 2006, pp. 141925.

Zang et al., "Nanoscale lateral epitaxial overgrowth of GaN on Si (111)," Applied Physics Letters, vol. 87, No. 19 (Nov. 7, 2005) pp. 193106.1-193106.3.

Zela et al., "Single-crystalline Ge Grown Epitaxially on Oxidized and Reduced Ge/Si (100) Islands," Journal of Crystal Growth, vol. 263, 2004, pp. 90-93.

Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 7, 2001, pp. 812-816.

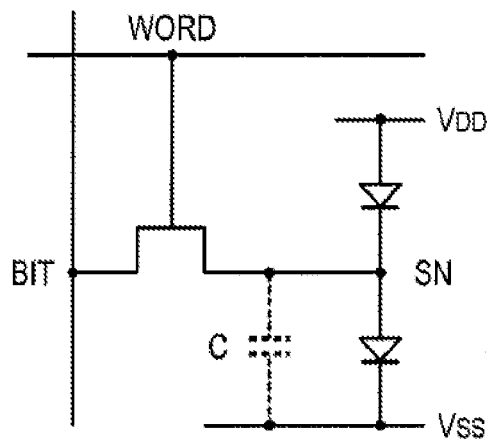
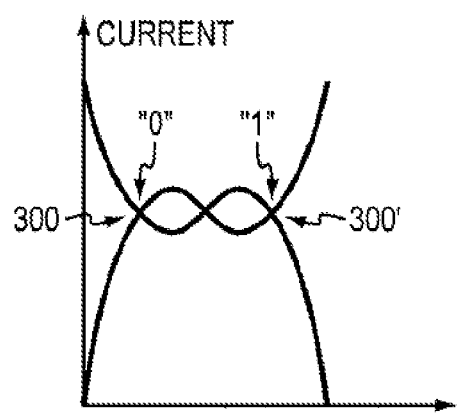
PRIOR ART
FIG. 3

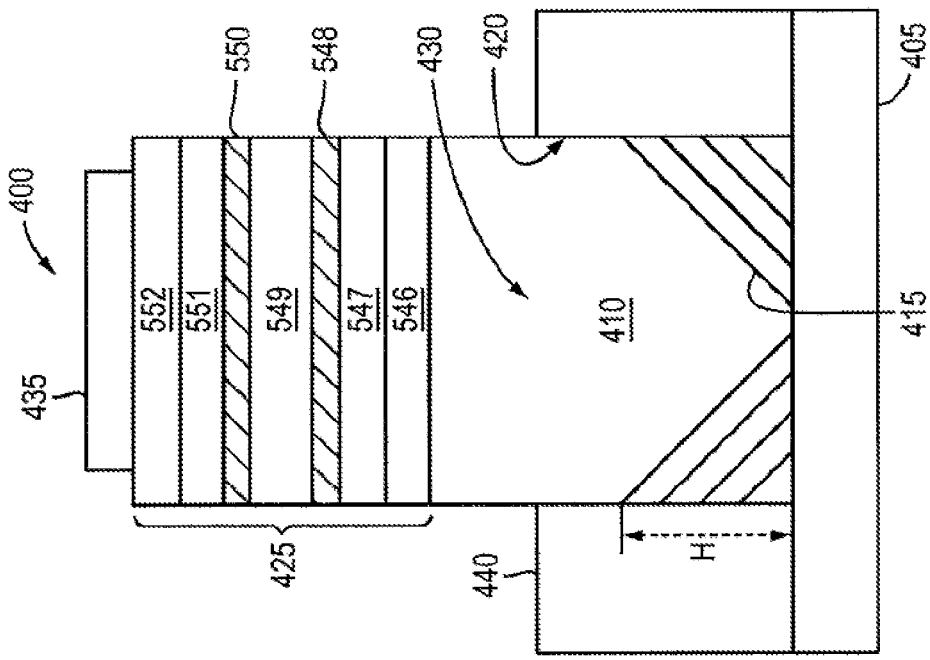
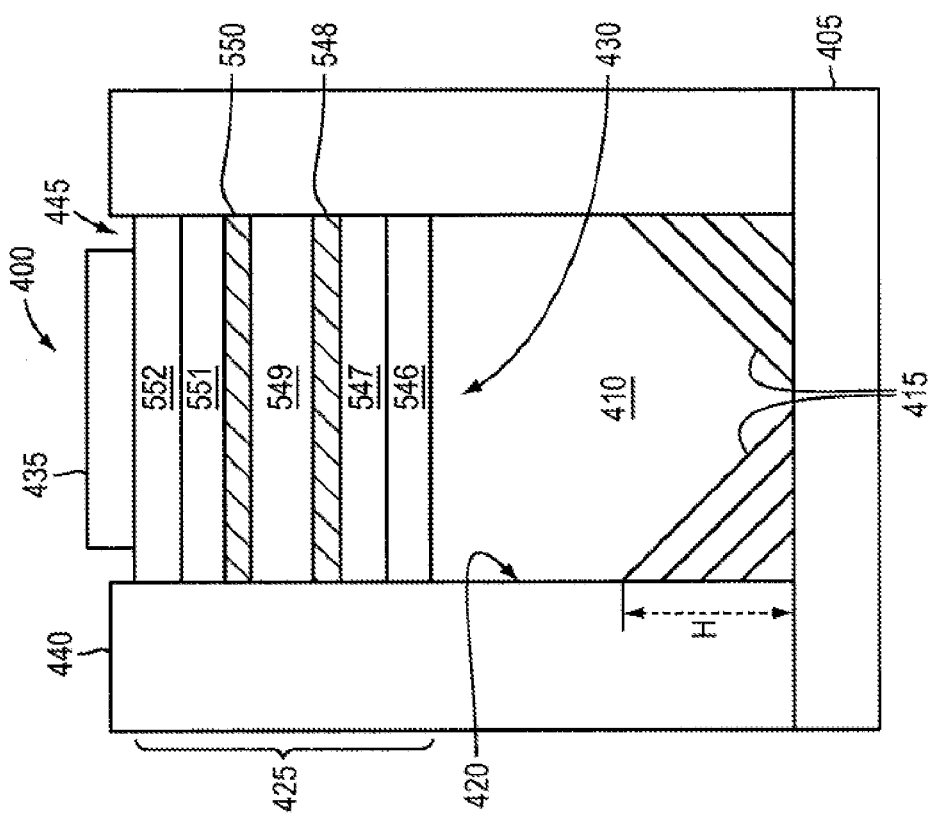

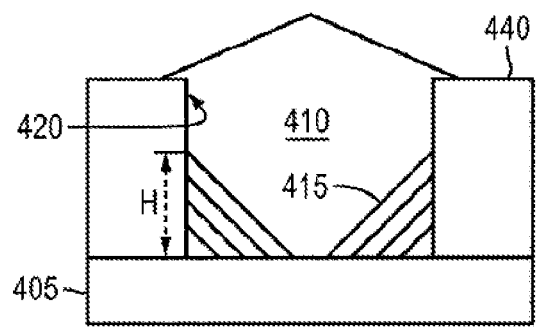
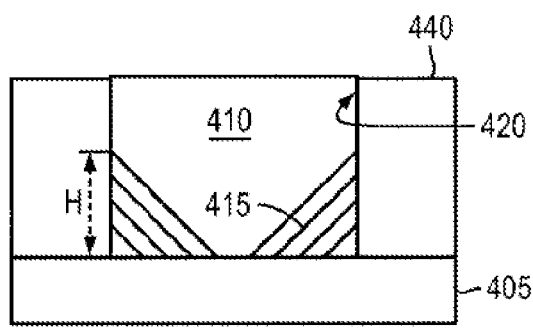
FIG. 8a          FIG. 8b
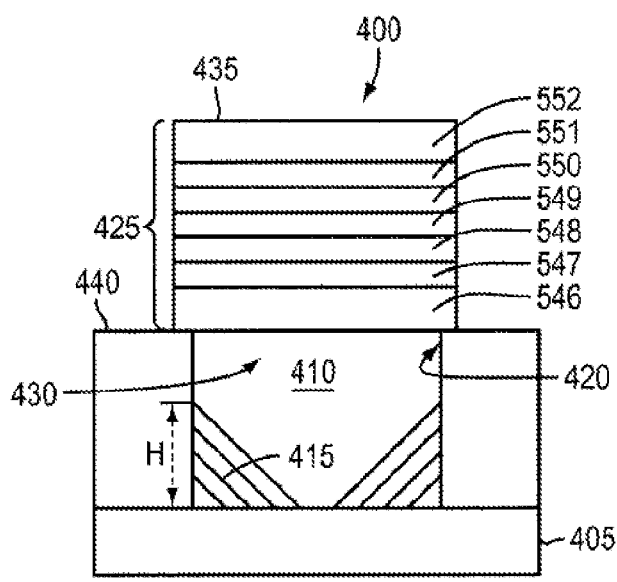
FIG. 8c

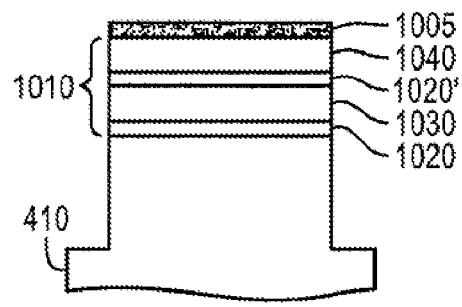
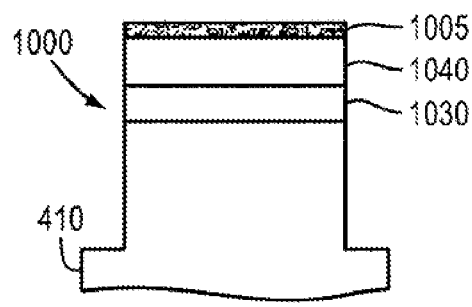
FIG. 10a  FIG. 10b
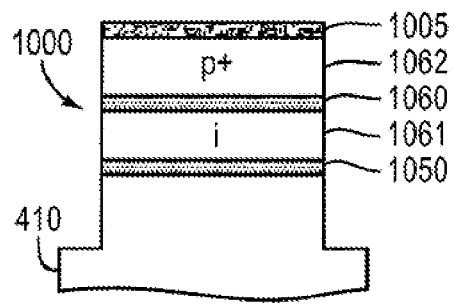
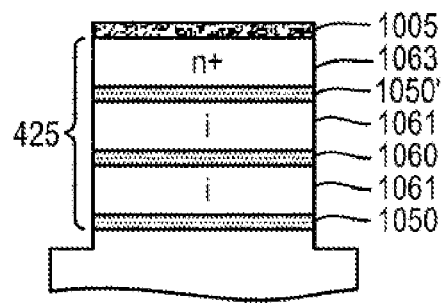
FIG. 10c  FIG. 10d
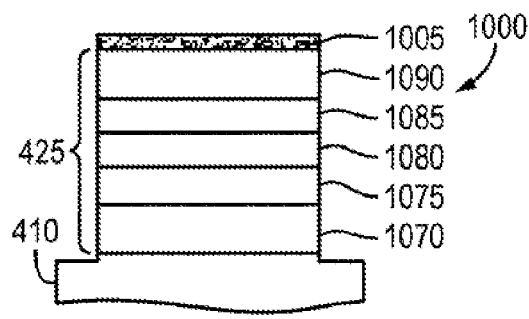
FIG. 10e

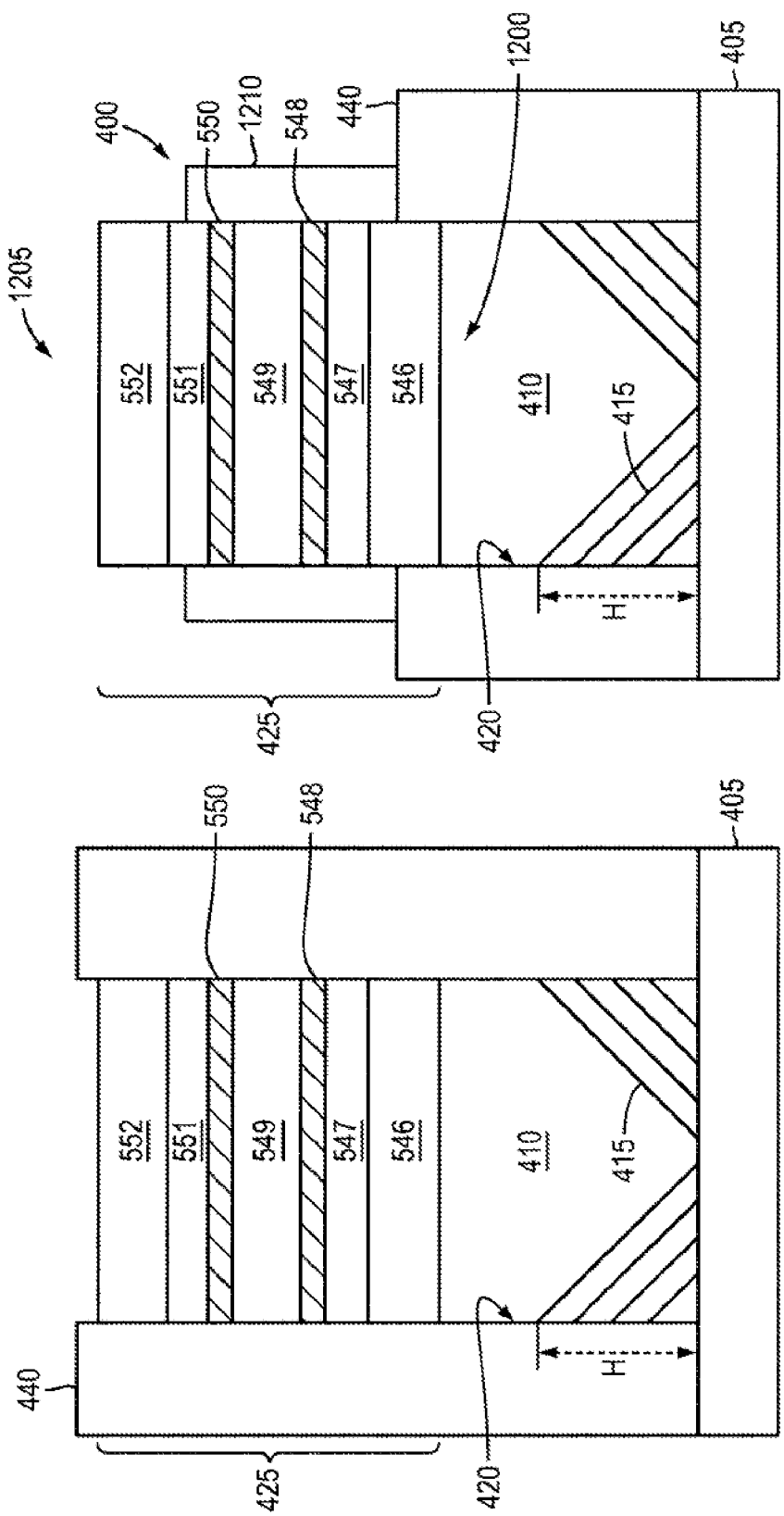

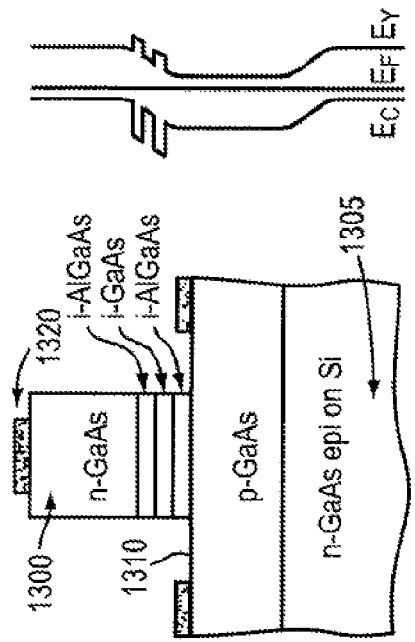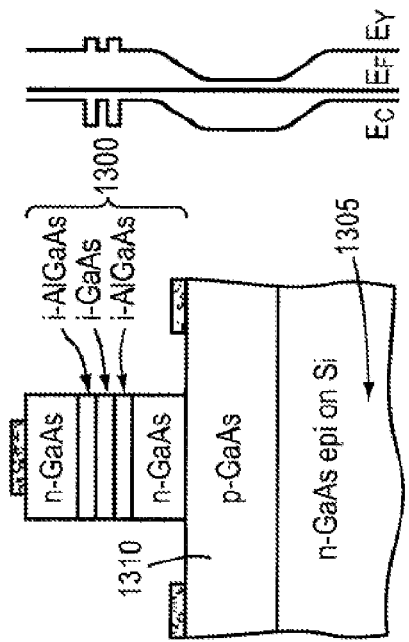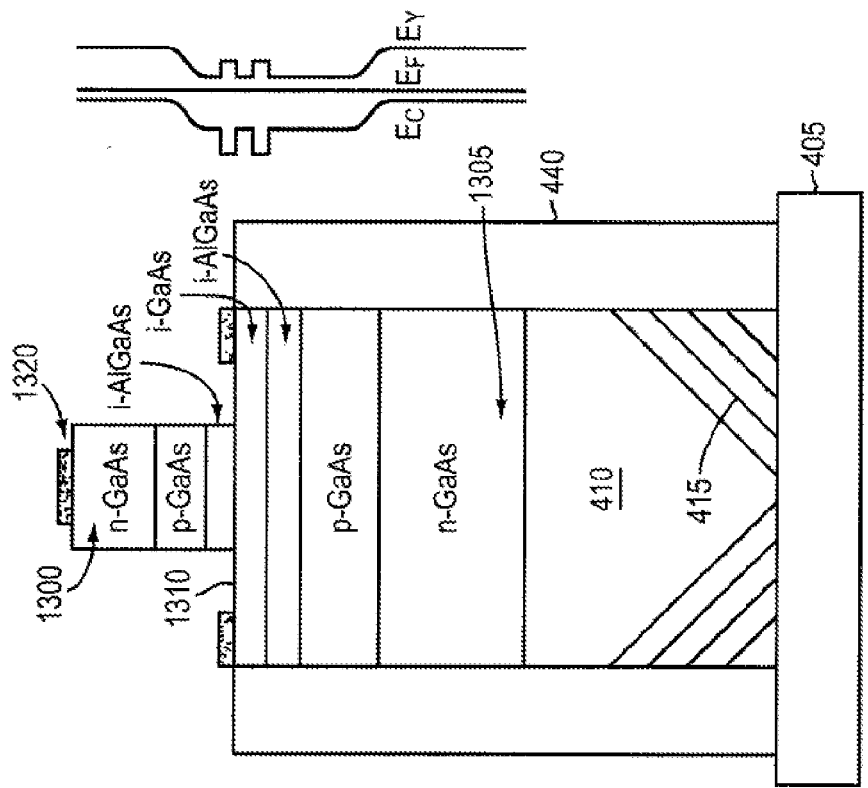
FIG. 14b
FIG. 14c
FIG. 14a

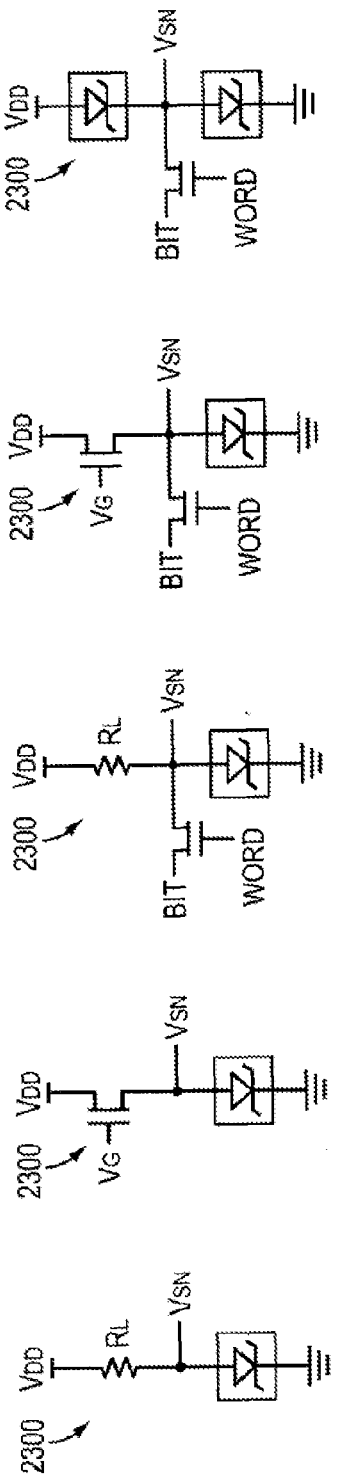
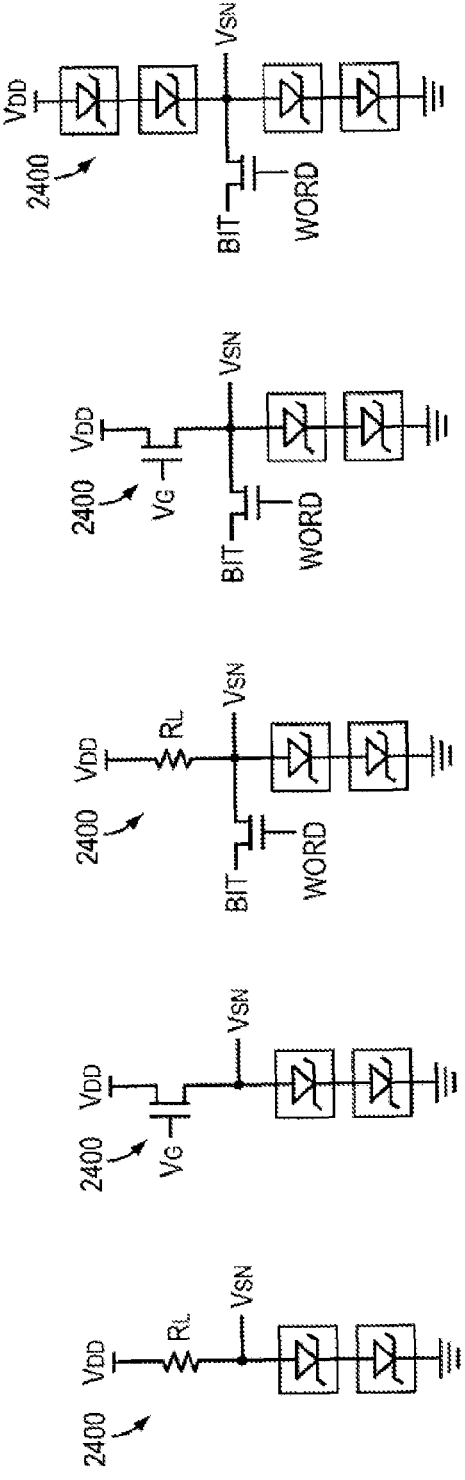
FIG. 23a  FIG. 23b  FIG. 23c  FIG. 23d  FIG. 23e
FIG. 24a  FIG. 24b  FIG. 24c  FIG. 24d  FIG. 24e

EXAMPLE OF MODERN GPU ARCHITECTURE
(XBOX 360)

QUANTUM TUNNELING DEVICES AND CIRCUITS WITH LATTICE-MISMATCHED SEMICONDUCTOR STRUCTURES

RELATED APPLICATIONS

This application is a continuation of U.S. patent application Ser. No. 14/109,478, filed on Dec. 17, 2013, entitled "Quantum Tunneling Devices and Circuits with Lattice-Mismatched Semiconductor Structures," which is a continuation of U.S. patent application Ser. No. 13/544,661, filed on Jul. 9, 2012, entitled "Quantum Tunneling Devices and Circuits with Lattice-Mismatched Semiconductor Structures," which is a divisional of U.S. patent application Ser. No. 12/973,616, filed on Dec. 20, 2010, entitled "Quantum Tunneling Devices and Circuits with Lattice-Mismatched Semiconductor Structures," which is a divisional of U.S. patent application Ser. No. 11/862,850, filed on Sep. 27, 2007, entitled "Quantum Tunneling Devices and Circuits with Lattice-Mismatched Semiconductor Structures," which claims the benefit of and priority to U.S. Provisional Application Ser. No. 60/848,037 filed Sep. 27, 2006, and U.S. Provisional Application Ser. No. 60/923,838 filed Apr. 17, 2007; the disclosures of these applications are hereby incorporated by reference in their entireties.

FIELD OF THE INVENTION

This invention relates to methods and materials for formation of structures including tunneling devices built on alternative materials (i.e., non-silicon (Si)). More particularly, it relates to resonant tunneling devices and circuits using lattice-mismatched semiconductor hetero structures.

BACKGROUND

Electronic devices utilizing quantum tunneling mechanism are potential candidates to replace conventional Si-based devices as a new type of logic device, or to enhance the performance of conventional Si-based devices and circuits when used together with the conventional Si devices. Quantum tunneling devices inherently have very high speeds and also can enable more functionality. Their negative differential resistance (NDR) characteristics result in an inherent latching mechanism that enables very compact circuit configurations. They may be utilized to construct high speed and low power dissipation logic and memory circuits. A tunneling device-based circuit also has a much smaller footprint since fewer devices are needed in constructing a functional circuit, in comparison to a conventional circuit.

SUMMARY

The embodiments discussed in detail below allow integration of quantum tunneling devices into a variety of technologies and materials. For example, using III-V materials for resonant tunneling diodes (RTDs) in conjunction with circuits built over Si-based substrates allows the implementation of a wide variety of applications with increased performance and higher circuit densities. Si-based applications that benefit from III-V based RTD integration include static random access memory (SRAM), dynamic RAM (DRAM), digital signal processing (DSP) and field programmable gate array (FPGA). These represent a few examples of chips and applications using just one type of tunneling device.

Examples of various quantum tunneling devices include: Esaki diodes (also called tunnel diodes); single-barrier tunnel diodes; resonant tunneling diodes (RTD), which are typically use intraband tunneling with double-barriers; triple-barrier or multiple-barrier resonant tunneling diodes; resonant interband tunneling diodes (RITD); single-barrier interband-tunneling diodes; resonant tunneling transistors (RTT); resonant tunneling field-effect transistors (RTFET), double electron layer tunnel transistors (DELTT); quantum-well-based resonant tunneling transistors (QWBRTT); resonant tunneling bipolar transistors (RTBT or RBT); resonant tunneling hot-electron transistors (RHET), etc.

Of these devices, the RTD is one of the most basic device structures. Referring to FIG. 1, the RTD is a conventional two-terminal diode 20, as described in U.S. Pat. No. 5,825,049. The illustrated RTD includes a cathode 22, a bulk emitter 24, an undoped layer 26, a two-dimensional resonant electron layer 27, thin barriers 28, another undoped layer 29, a bulk collector 30, and an anode 32, all disposed over a substrate 34. The RTD is typically realized in III-V semiconductor material system, where heterojunctions create a quantum well, switched by two barrier layers that enable resonant tunneling. Their current-voltage relationship exhibits a characteristic "N" shape, and thus a characteristic NDR region. This characteristic originates from abrupt changes in the probability of quantum mechanical tunneling through a potential barrier with applied bias over the diode. A variation of the RTD is an RITD. A three-terminal RTT may be constructed by adding a control terminal to an RTD structure. A resonant tunneling structure and mechanism may be integrated into a three-terminal transistor device in many other ways.

Referring to FIG. 2, a DELTT transistor, including a thin tunnel barrier 40, is positioned between two two-dimensional quantum wells (QW) 45, 50. In operation, electrons quantum mechanically tunnel from one well to the other through the barrier. Electrical contact is made by a top layer contact 52 to the top QW 45 only by the source, and by a bottom layer contact 54 to the bottom QW 50 only by the drain, in both cases accomplished by using the top and back depletion gates 55, 60 to remove electrons from the QW that one does not wish to contact. Tunneling between the two QWs occurs only when electrons in both wells have substantially identical momentum and energy; this may be controlled by the top control gate. A control gate 65 is disposed over the structure. A total thickness of the semiconductor layers is kept less than 2 microns, allowing the back depletion gate to be brought close to the QWs and the entire device to be made small. The illustrated device includes two gallium arsenide layers, each 150 angstroms thick, separated by a 125 angstrom aluminum gallium arsenide barrier. At left is shown the energy band diagram 65 of the structure, containing the two quantum wells separated by the thin tunnel barrier 40.

The resonant tunneling device is one of the potential emerging logic devices to continue functional scaling of electronics integrated circuits beyond the end of Si-based CMOS technology roadmap. This class of devices may include RTT and hybrid tunneling devices or circuit units that include both tunneling devices and conventional devices such as MOSFETs or HEMTs, etc. For example an RTD-FET includes several RTDs and one or more conventional FETs.

A hybrid system can potentially provide more computational power and/or functionality since it requires fewer devices in comparison to the conventional logic circuit and it is inherently faster due to the RTD's intrinsic high switching speed and negative differential resistance property, and yet it uses less power than conventional devices. Referring to FIG. 3, for example, by connecting a conventional FET with two RTDs in series, one forms a static random access memory (SRAM) structure. The illustrated tunnel diode SRAM has two stable operating points 300, 300' that may be used to represent "0" and "1" in memory operation. This device has the potential to reduce the cell size in comparison to the conventional 6-transistor SRAM (6-T SRAM). It is refresh-free and offers a low power consumption advantage. When multiple RTDs are connected together, the SRAM cell offers multi-value memory operation.

Another example is a comparator circuit. A conventional latched comparator may include 12 high electron mobility transistors (HEMTs) and 6 Schottky diodes. An RTD-based latched comparator has been fabricated with 2 RTDs and 2 HEMTs, with latching behavior being inherent to RTD devices. The unit area is reduced to one sixth in comparison to the conventional comparator.

One of the challenges of tunneling devices is that they are conventionally fabricated in III-V material systems, and thus typically are difficult to integrate into Si-based systems. Also the cost is typically high, which limits their widespread application.

Fabricating resonant tunneling devices on a Si-based substrate is highly desirable. Recently, several group IV-based, i.e., Si/SiGe-based, tunneling devices have been developed that enable the integration of the tunneling devices into Si systems, including a tri-state logic devices fabricated in SiGe, a Si-based field-induced band-to-band tunneling transistors, Si/SiGe RITDs. However, there are new technical challenges with those structures. For example, Si/SiGe RITD devices typically require epitaxial growth in low temperature molecular beam epitaxy (MBE) systems, instead of metal-organic chemical vapor deposition (MOCVD) systems that may be unable to achieve the preferred high n-type phosphorus doping and also suffer from phosphorus poisoning issues. Moreover, the Si/SiGe RITD also typically has lower performance than an optimized III-V RITD device.

There is thus a need to develop new methods and structures to fabricate tunneling devices on Si substrates with improved material systems, such as III-V and II-VI material. There is also a need to develop new methods to fabricate alternative semiconductor materials for tunneling devices on Si substrates using improved material growth techniques, such as, for example, CVD. There is also a need to develop new structures and methods to incorporate tunneling devices in circuits on Si substrates for various functions.

Embodiments of the present invention include methods and structures for fabricating tunneling devices on a first type of substrate, e.g., group IV, with improved material systems, e.g., III-V and II-VI materials. The manufacturing process may be compatible with conventional CMOS processes utilizing Si substrates. The process flow may include an aspect ratio trapping (ART) epitaxial technique.

In another embodiment, manufacturing methods use epitaxy techniques, including MBE and CVD systems, for ART. CVD has a number of advantages, including low defect density, high quality regrowth capability, rapidly varying alloy compositions, and improved manufacturability due to CVD's higher throughput, relatively short downtimes, and scalability to very large reactors Embodiments of the invention also include new structures and methods for functional circuits incorporating both tunneling devices and conventional Si-based devices. Such circuit units may function as, e.g., a logic circuit, an SRAM or a DRAM.

In an aspect, the invention includes a structure. The structure has a non-crystalline material defining an opening having a sidewall disposed above a surface of a substrate that comprises a first crystalline semiconductor material. The opening has a non-crystalline sidewall. A second crystalline semiconductor material, lattice-mismatched to the first crystalline semiconductor material, is disposed in the opening. A tunneling device is disposed over at least a portion of the second crystalline semiconductor material.

One or more of the following features may be included. The tunneling device may be, e.g., an Esaki diode (tunnel diode), a single-barrier tunnel diode, an RTD, a triple-barrier or multiple-barrier resonant tunneling diode, an RITD, a single-barrier interband-tunneling diode, an RTT, an RTFET, a DELTT, a QWBRTT, an RTBT or RBT, or an RHET.

The structure may comprise a memory cell, with a phase change layer or a ferroelectric material disposed over the tunneling device. The structure may include memory circuitry, such as SRAM circuitry, DRAM circuitry, or non-volatile memory circuitry, that includes the tunneling device.

The first crystalline semiconductor material may include a group IV element or compound, a II-VI compound, and/or a III-V compound, and the second crystalline material may include a group IV element or compound, a II-VI compound, and/or a III-V compound. The first crystalline semiconductor material and the second crystalline semiconductor material may include materials selected from different groups.

A majority of defects arising from the lattice-mismatch of the first and second crystalline semiconductor materials may terminate within the opening, e.g., below a height of the opening. The width of the opening may be less than the height of the opening. The tunneling device may be in contact with at least a portion of the second crystalline material. A circuit component, such as a MOSFET, a MISFET, a HEMT, a capacitor, or a resistor, may be coupled to the tunneling device and disposed above a region of the substrate. The tunneling device may include a tunneling diode disposed above a transistor. The circuit component may include a gate array, a memory circuit, and/or a processor circuit.

The tunneling diode may be disposed above a source or drain of a transistor. A second tunneling diode may be disposed over the source or drain of the transistor.

In another aspect, the invention features a method for forming a structure. The method includes the formation of an opening above a region of a substrate comprising a first crystalline semiconductor material. The opening is defined by a dielectric sidewall and an exposed surface of the substrate. A second crystalline semiconductor material lattice-mismatched to the first crystalline semiconductor material is formed in the opening. A tunneling device is defined over at least a portion of the second crystalline semiconductor material.

One or more of the following features may be included. The tunneling device may be, e.g., an Esaki diode (tunnel diode), a single-barrier tunnel diode, an RTD, a triple-barrier or multiple-barrier resonant tunneling diode, an RITD, a single-barrier interband-tunneling diode, an RTT, an RTFET, a DELTT, a QWBRTT, an RTBT or RBT, or an RHET. The second crystalline material may be formed in the window by selective epitaxy. The opening may be formed above a region of a transistor. The second crystalline semiconductor material may include a II-VI compound and/or a III-V compound.

In still another aspect, the invention includes a structure integrating a tunneling diode and a transistor using lattice-mismatched materials. The structure includes the transistor formed proximate a substrate including a first crystalline semiconductor material. The tunneling diode is coupled to one of a source or a drain of the transistor, and the tunneling diode is formed using a second crystalline semiconductor material lattice-mismatched to the first crystalline semiconductor material. At least a portion of the second semiconductor material is disposed within an opening disposed above the substrate. The opening has a non-crystalline sidewall and configured to trap a majority of defects arising from the lattice mismatch between the first and second semiconductor materials.

In another aspect, the invention includes a method of reducing SRAM circuit surface area. The method includes the formation of an RTD-based static random access memory (SRAM) circuit. The RTD-based SRAM circuit has a perimeter defining an RTD-based SRAM cell area, the cell area including circuit components defining an SRAM memory cell. A transistor having a gate length is formed above a substrate including a first crystalline material. At least one RTD is formed proximate an opening disposed above the substrate, the opening comprising a non-crystalline sidewall. The RTD is coupled to a source or a drain of the transistor and includes crystalline material lattice-mismatched to the first crystalline material. The RTD-based SRAM cell area is at least 33% smaller than a surface area of an SRAM circuit constructed using six transistors having the same gate length as the transistor in the RTD-based SRAM cell area.

In still another aspect, the invention features a method of forming a transistor structure including a tunneling structure. The method includes the formation of an opening above a surface of a substrate comprising a first crystalline semiconductor material. The opening has a non-crystalline sidewall. A second crystalline semiconductor material is formed in the opening. The second crystalline semiconductor material is lattice-mismatched to the first crystalline semiconductor material. A majority of defects arising from lattice-mismatch between the first and second semiconductor materials terminate within the opening. A tunneling structure is formed over and in contact with at least a portion of the second crystalline semiconductor material. First, second, and third terminals of a transistor are formed proximate the tunneling structure.

In an aspect, the invention features a structure. The structure includes a substrate comprising a first crystalline semiconductor material, and a window defined in a dielectric layer disposed over the first semiconductor substrate. Disposed in the window is a second crystalline semiconductor that is lattice-mismatched to the first crystalline semiconductor material. A tunneling device is disposed over and in contact with at least a portion of the second crystalline semiconductor material.

In some embodiments, the tunneling device may be an RTD, a triple-barrier or multiple-barrier resonant tunneling diode, an RITD, an RTT, an RTFET, a DELTT, a quantum-well-base resonant tunneling transistor (QEBRTT), an RTBT or RBT, or an RHET. The first crystalline semiconductor material comprises or consists essentially of at least one of a group IV element, a II-VI compound, or a III-V compound. The second crystalline semiconductor material comprises a II-VI compound and/or a III-V compound. A phase change layer is disposed over the tunneling device, and the structure includes a memory cell. A ferroelectric material is disposed over the tunneling device, and the structure includes a memory cell. Memory circuitry, such as SRAM circuitry, DRAM circuitry, or non-volatile memory circuitry, may include the tunneling device.

In another aspect, the invention features a method for forming a structure. The method includes the formation of a masking layer over a substrate comprising a first crystalline semiconductor material. A window is defined in the masking layer. The window is filled with a second crystalline semiconductor material that is lattice-mismatched to the first crystalline semiconductor material. A tunneling device is disposed over and in contact with at least a portion of the second crystalline semiconductor material.

The tunneling device may be a DELTT, an RTD, or an RITD. The window may be filled by selective epitaxy.

In another aspect, the invention features a structure. The structure includes a substrate comprising a first crystalline semiconductor material, and an RTD comprising a second crystalline semiconductor material disposed over the substrate. The first crystalline semiconductor material includes a group IV element or compound and the second crystalline semiconductor material includes a III-V or a II-VI compound.

In another aspect, the invention features a structure. The structure includes a substrate including a first crystalline semiconductor material comprising a group IV element; An RITD is disposed over the substrate. The RITD includes a second crystalline semiconductor material lattice-mismatched to the first crystalline semiconductor material, the second crystalline semiconductor material including at least one of a III-V compound or a II-VI compound. The RITD includes a bottom injector layer, a bottom spacer, a top spacer, a top injector layer separated by an offset from the bottom injector, the bottom injector and top injector layers forming the ends of a p-i-n junction, and a material inserted between the bottom injector and top injector which serves as a tunnel barrier, and where i in the p-i-n junction represents at least one material provided between the bottom and top injectors.

In another aspect, the invention features a structure. The structure includes a substrate comprising a first crystalline semiconductor material comprising a group IV element and a DELTT device disposed over the substrate. The DELTT device includes a second crystalline semiconductor material lattice-mismatched to the first crystalline semiconductor material, the second crystalline semiconductor material including at least one of a III-V compound or a II-VI compound. The DELTT device includes an emitter contact, a collector contact, a two dimensional quantum well emitter layer electrically contacting the emitter contact, and a two dimensional quantum well resonant tunneling layer. The DELTT device also includes a collector layer disposed opposite the resonant tunneling layer from the emitter layer, the collector layer electrically contacting the collector contact, a first tunneling barrier layer disposed between the emitter layer and the resonant tunneling layer, a second tunneling barrier layer disposed between the resonant tunneling layer and the collector layer; and a voltage drop layer between the resonant tunneling layer and the collector.

In another aspect the invention features a structure. The structure includes a substrate comprising a first crystalline semiconductor material, and a magnetic resonant tunneling diode comprising a second crystalline semiconductor material disposed over the substrate. The first crystalline semiconductor material may comprises or consist essentially of a group IV element or compound and the second crystalline semiconductor material may comprise or consist essentially of a III-V or a II-VI compound.

In another aspect, the invention features a structure. The structure includes a substrate comprising a first crystalline semiconductor material. A first window is defined in a dielectric layer disposed over the first semiconductor substrate. A first device is disposed over the first window. A second window is defined in a dielectric layer disposed over the first semiconductor substrate. A second crystalline semiconductor is disposed in the second window, the second crystalline semiconductor material being lattice-mismatched to the first crystalline semiconductor material. A tunneling device is disposed over and in contact with at least a portion of the second crystalline semiconductor material. The first device and the tunneling device are interconnected to form a circuit unit.

In yet another aspect, the invention features a structure including a substrate that comprises a first crystalline semiconductor material. A dielectric layer is disposed over at least a portion of the substrate and has a window defined therein. A second crystalline semiconductor material is disposed in the window and over the first crystalline semiconductor material, and is lattice-mismatched to the first crystalline semiconductor material. A tunneling device is disposed over and in contact with at least a portion of the second crystalline semiconductor material over a first region of the substrate. A circuit component is formed over a second region of the substrate. The first crystalline semiconductor material includes a group IV element or compound, a II-VI compound, and/or a III-V compound, the second crystalline material includes a group IV element or compound, a II-VI compound and/or a III-V compound, and the first crystalline semiconductor material and the second crystalline semiconductor material include materials selected from different groups.

The following feature may be included. The circuit component may be a MOSFET, a MISFET, a HEMT, a capacitor, or a resistor.

In another aspect, a structure may include a substrate comprising a first crystalline semiconductor material. A dielectric layer is disposed over at least a portion of the substrate and has a window defined therein. A second crystalline semiconductor material is disposed in the window and over the first crystalline semiconductor material, the second crystalline semiconductor material being lattice-mismatched to the first crystalline semiconductor material. An amplifier includes (i) a tunneling diode disposed over and in contact with at least a portion of the second crystalline semiconductor material, and (ii) a resistor. The first crystalline semiconductor material includes a group IV element or compound, a II-VI compound, and/or a III-V compound, the second crystalline material includes a group IV element or compound, a II-VI compound and/or a III-V compound, and the first crystalline semiconductor material and the second crystalline semiconductor material include materials selected from different groups.

In another aspect, the invention features a structure including a substrate comprising a first crystalline semiconductor material. A dielectric layer is disposed over at least a portion of the substrate and has a window defined therein. A second crystalline semiconductor material is disposed in the window and over the first crystalline semiconductor material, the second crystalline semiconductor material being lattice-mismatched to the first crystalline semiconductor material. A memory cell includes a tunneling diode is disposed over and in contact with at least a portion of the second crystalline semiconductor material. The first crystalline semiconductor material includes a group IV element or compound, a II-VI compound, and/or a III-V compound, the second crystalline material includes a group IV element or compound, a II-VI compound and/or a III-V compound, and the first crystalline semiconductor material and the second crystalline semiconductor material include materials selected from different groups.

In another aspect, the invention features a structure including a substrate comprising a first crystalline semiconductor material. A window is defined in a dielectric layer disposed over the substrate. A second crystalline semiconductor material is disposed in the window, the second crystalline semiconductor material being lattice-mismatched to the first crystalline semiconductor material. A logic inverter includes (i) a tunneling device disposed over and in contact with at least a portion of the second crystalline semiconductor material, and (ii) a MOSFET. The first crystalline semiconductor material includes a group IV element or compound, a II-VI compound, and/or a III-V compound, the second crystalline material includes a group IV element or compound, a II-VI compound and/or a III-V compound, and the first crystalline semiconductor material and the second crystalline semiconductor material include materials selected from different groups.

In another aspect, the invention features a structure including a substrate comprising a first crystalline semiconductor material. A dielectric layer is disposed over at least a portion of the substrate and has a first window and a second window defined therein. A second crystalline semiconductor material is disposed in each of the first and second windows and over the first crystalline semiconductor material. The second crystalline semiconductor material is lattice-mismatched to the first crystalline semiconductor material. An SRAM includes (i) a first resonant tunneling diode disposed over and in contact with at least a portion of the second crystalline semiconductor material disposed in the first window, (ii) a second resonant tunneling diode disposed over and in contact with at least a portion of the second crystalline semiconductor material disposed in the second window, and (iii) a MOSFET. The first crystalline semiconductor material includes a group IV element or compound, a II-VI compound, and/or a III-V compound, the second crystalline material includes a group IV element or compound, a II-VI compound and/or a III-V compound, and the first crystalline semiconductor material and the second crystalline semiconductor material include materials selected from different groups.

One or more of the following features may be included. Each of the first and second resonant tunneling diodes may be in electrical communication with a drain of the MOSFET. Each of the first and second resonant tunneling diodes may be in electrical communication with a gate of the MOSFET.

In another aspect, the invention features a structure including a substrate comprising a first crystalline semiconductor material. A dielectric layer is disposed over at least a portion of the substrate and has plurality of windows defined therein. A second crystalline semiconductor material is disposed in each of the plurality of windows and over the first crystalline semiconductor material, the second crystalline semiconductor material being lattice-mismatched to the first crystalline semiconductor material. A field programmable array includes a plurality of SRAMs, each SRAM comprising (i) a first resonant tunneling diode disposed over and in contact with at least a portion of the second crystalline semiconductor material disposed in one of the plurality of windows, (ii) a second resonant tunneling diode disposed over and in contact with at least a portion of the second crystalline semiconductor material disposed in another of the plurality of windows, and (iii) a MOSFET. The first crystalline semiconductor material includes a group IV element or compound, a II-VI compound, and/or a III-V compound, the second crystalline material includes a group IV element or compound, a II-VI compound and/or a III-V compound, and the first crystalline semiconductor material and the second crystalline semiconductor material include materials selected from different groups.

In another aspect, the invention features a structure that includes a substrate comprising a first crystalline semiconductor material. A dielectric layer is disposed over at least a portion of the substrate and has a plurality of windows defined therein. A second crystalline semiconductor material is disposed in each of the windows and over the first crystalline semiconductor material, the second crystalline semiconductor material being lattice-mismatched to the first crystalline semiconductor material. A microprocessor includes (i) arithmetic logic units (ALU) adapted for executing arithmetic and logical functions; (ii) storage locations and memory units adapted to store data, addresses, instructions and control programs; and (iii) control systems and interconnection systems adapted to provide links among different components, accept and generate external control signals, and to provide timing signals. At least one of the ALU, storage locations and memory units, and control and interconnection systems comprises a tunneling device disposed over and in contact with the second crystalline semiconductor material. The first crystalline semiconductor material includes a group IV element or compound, a II-VI compound, and/or a III-V compound, the second crystalline material includes a group IV element or compound, a II-VI compound and/or a III-V compound, and the first crystalline semiconductor material and the second crystalline semiconductor material include materials selected from different groups.

In another aspect, the invention features a method for forming a structure. The method includes providing a substrate comprising a first crystalline semiconductor material and a dielectric layer disposed thereover. A CMOS device is formed in a first region of the substrate. A window is defined in the dielectric layer to expose at least a portion of a surface of the first semiconductor material. The window is filled with a second crystalline semiconductor material lattice-mismatched to the first crystalline semiconductor material. A tunneling device is defined over and in contact with at least a portion of the second crystalline semiconductor material. An interconnection is formed between the tunneling device and the CMOS device.

In yet another aspect, the invention features a method for forming a structure, the method including providing a substrate comprising a first crystalline semiconductor material. A masking layer is formed over the substrate. A window is defined in the masking layer. The window is filled with a second crystalline semiconductor material lattice-mismatched to the first crystalline semiconductor material, the second semiconductor material having a total thickness higher than a height of the masking layer. The second semiconductor material is planarized to define a planar surface of the second semiconductor material. A tunneling device is defined over and in contact with at least a portion of the second crystalline semiconductor material. Planarizing the second semiconductor material may include chemical-mechanical polishing utilizing the masking layer as a polishing stop.

BRIEF DESCRIPTION OF THE FIGURES

FIG. 3 illustrates a circuit of a tunnel diode SRAM and its associated IV curve, prior art;

FIGS. 6a-6b is a cross-sectional view of an RTD formed with the use of ART and including contacts thereto in accordance with an embodiment of the invention;

FIGS. 7a-7b and 8a-8c are cross-sectional views of device structures with non-flat top surfaces formed with the use ART in accordance with embodiments of the invention;

FIGS. 10a-10e are cross-sectional views of five different RITD structures formed with the use of ART in accordance with embodiments of the invention;

FIGS. 12a-12b are a pair of cross-sectional views illustrating a process for forming an RTFET in accordance with an embodiment of the invention;

FIGS. 14a-14c are cross-sectional views of tunneling quantum structures integrated within a bipolar transistor, formed with the use of ART in accordance with embodiments of the invention, as well as the corresponding energy-band diagrams;

FIG. 16a is a cross-sectional view of a multi-state RTBT formed by ART in accordance with an embodiment of the invention; FIG. 16b is an energy-band diagram of the device of FIG. 16a;

FIGS. 23a-23e, 24a-24e, and 25 are diagrams illustrating SRAMs incorporating RTD devices formed in accordance with embodiments of the invention;

DETAILED DESCRIPTION OF THE INVENTION

Although the following examples are illustrated with particular III-V material systems for tunneling device on Si substrates, embodiments of this invention may include other materials systems, such as SiGe, Ge, III-V and/or II-VI. The described structures may be fabricated on various semiconductor substrates, such as Si substrates, Ge substrates, semiconductor-on-insulator (SOI) substrates, strained-semiconductor-on-insulator (SSOI) substrates, and other substrate systems. Embodiments of the invention also include other similar tunneling device structures and circuit units. Structures may include various tunneling devices and various circuit units; methods are described herein for producing such structures or circuit units on a first type of substrate, e.g., from group IV such as a Si or Ge substrate, with improved material systems, e.g., III-V and II-VI epitaxial materials. The III-V or II-VI epitaxial layers may be grown selectively on conventional substrates such as Si, SOI, or SSOI substrates in selected areas (such as the device active area). Such layers may be formed by a heteroepitaxy technique, e.g., by ART heteroepitaxial techniques, as described in pending U.S. patent application Ser. Nos. 11/436,198 and 11/436,062.

Cross-sectional TEM micrographs were taken of an experimental sample of lattice-mismatched semiconductor material grown within dielectric windows on a Si substrate by the ART heteroepitaxial technique. The micrographs demonstrated that defects, e.g., dislocations, are trapped by the dielectric sidewalls, resulting in high quality material suitable for device fabrication.

I. Individual Devices

Figure 1:
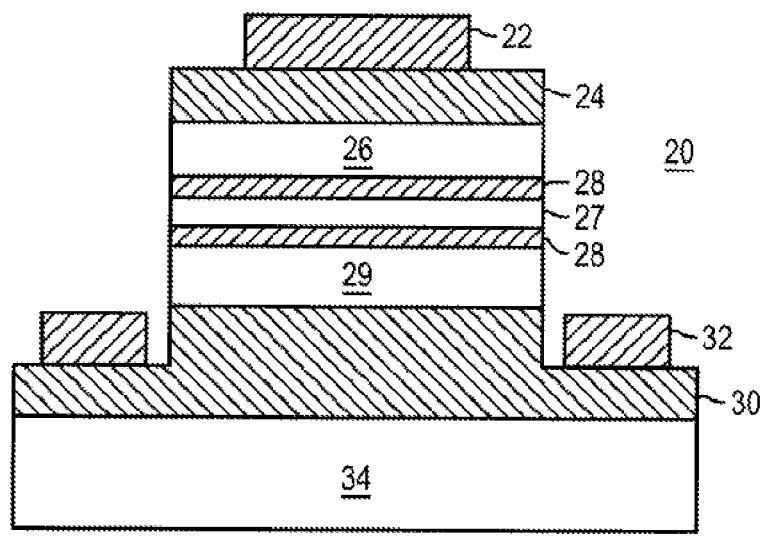
FIG. 1 is a cross-sectional view of an RTD or RITD device structure, prior art.
Figure 2:
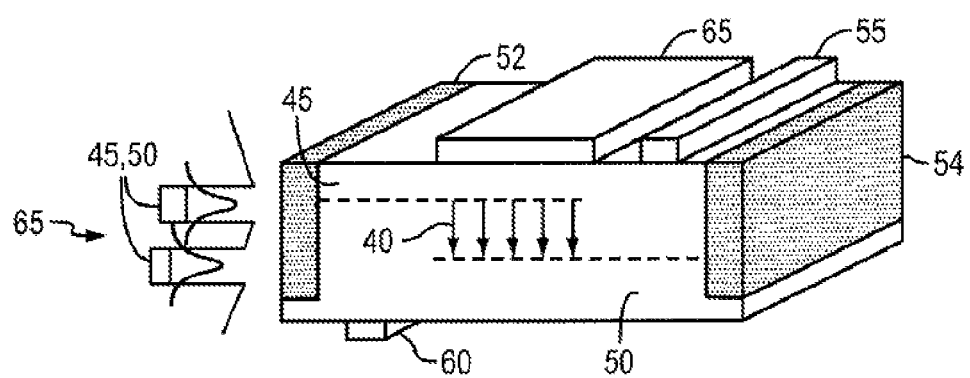
FIG. 2 is a perspective view of a double electron layer tunnel transistor (DELTT), prior art.
Figure 4:
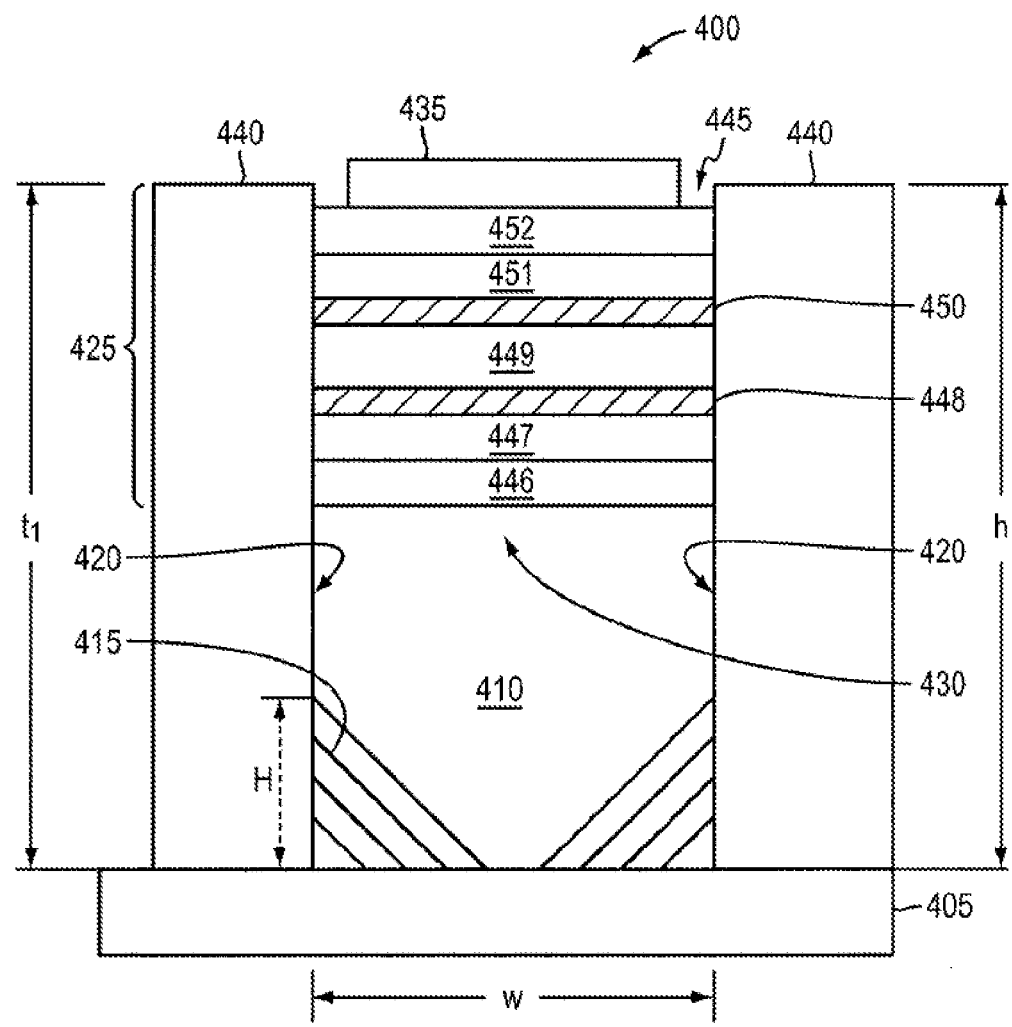
FIG. 4 is a cross-sectional view of a GaAs/AlGaAs RTD formed on a Si substrate with the use of ART in accordance with an embodiment of the invention.
Figure 5:
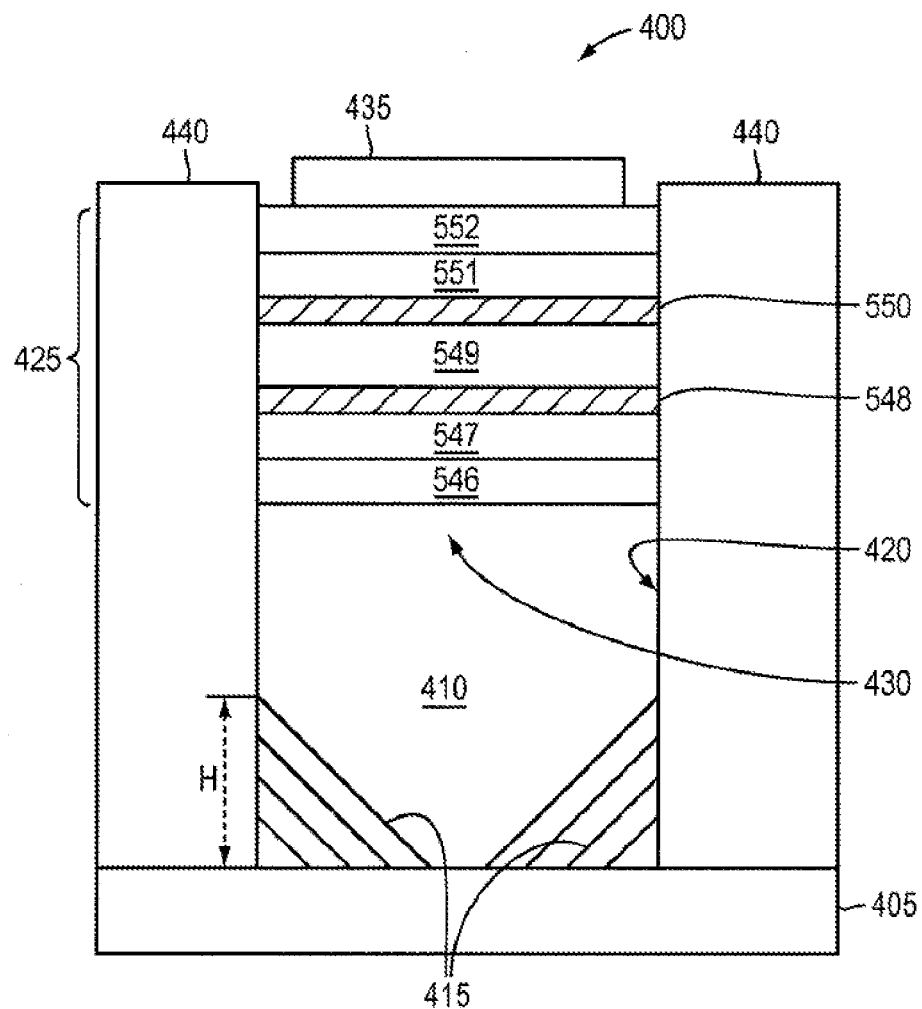
FIG. 5 is a cross-sectional view of an RTD formed with the use of ART and including III-V materials in accordance with an embodiment of the invention.

Referring to FIG. 4, the use of an ART technique enables the integration of low-defect III-V or II-VI materials on a Si substrate for tunneling device 400 fabrication. An exemplary RTD device structure is illustrated in FIG. 5. After a window is opened in a dielectric layer over a substrate 405, ART is used to grow a low-defect high-quality semiconductor material 410 (e.g., GaAs) on a Si surface, such that defects 415, e.g., dislocations and stacking faults, are trapped by the dielectric side walls 420, resulting a low-defect upper region of GaAs material. Next, multiple layers 425 of GaAs and AlGaAs are grown on the low-defect GaAs material by epitaxy. These layers may be used to fabricate an RTD device. This RTD device may be contacted via first contact 430 and second contact 435. In some embodiments, the first contact 430 may be the anode terminal and the second contact 435 may be the cathode terminal of tunneling device 400, and in other embodiments, the first contact 430 may be the cathode terminal and the second contact 435 may be the anode terminal.

A detailed preferred fabrication process is as follows. The substrate 405 may be, for example, a bulk silicon wafer, a bulk germanium wafer, a semiconductor-on-insulator (SOI) substrate, or a strained semiconductor-on-insulator (SSOI) substrate. The substrate 405 may include or consist essentially of a first semiconductor material, such as a group IV element, e.g., germanium or silicon. In an embodiment, the substrate 405 includes or consists essentially of (100) silicon.

A non-crystalline material, e.g., a dielectric layer 440, is formed over the semiconductor substrate 405. The dielectric layer 440 may include a dielectric material, such as silicon nitride or silicon dioxide. The dielectric layer 440 may be formed by a method known to one of skill in the art, e.g., thermal oxidation or plasma-enhanced chemical vapor deposition. As discussed below, the dielectric layer 440 may have a thickness $t_1$ corresponding to a desired height of crystalline material to be deposited in a window 445 formed through the dielectric layer 440. In some embodiments, the thickness $t_1$ of the dielectric layer 440 may be selected from a range of, e.g., 20-50000 nm.

A mask (not shown), such as a photoresist mask, is formed over the substrate 405 and the dielectric layer 440. The mask is patterned to expose at least a portion of the dielectric layer 440. The exposed portion of the dielectric layer 440 is removed by, e.g., reactive ion etching (RIE) to define the window 445. The window 445 extends to a surface of the substrate 405 and may be defined by at least one sidewall 420. The sidewall 420 is formed from the dielectric layer 440 and is, therefore, non-crystalline. The sidewall 420 may have a height h at least equal to a predetermined distance H from the surface of the substrate 405. It has been observed experimentally that dislocations 415 in a mismatched cubic semiconductor grown on a Si (100) surface in the near-vicinity (e.g., within approximately 500 nm or less) of a vertical dielectric sidewall 420 surface bend toward that surface at approximately 30 degrees through 60 degrees. For example, the dislocations 415 may bend toward that surface at approximately a 45 degree angle to that surface. Based on this relationship, one may typically expect the predetermined distance H necessary to trap defects 415 to be approximately equal to a width between ½ w and 2 w, where w is the width of the window 445.

The window 445 may be substantially rectangular in terms of cross-sectional profile, a top view, or both, and have a width w that is smaller than a length l (not shown) of the window. For example, the width w of the window may be less than about 5000 nm, e.g., about 20-1000 nm. In some embodiments, the width of the window is about 150 nm. A length l of the window may exceed each of w and H. A ratio of the height h of the window to the width w of the window may be ≥1, preferably between about 1 and about 50.

A second crystalline semiconductor material 410 is formed in the window. The second crystalline semiconductor material 410 may include or consist essentially of a group IV element or compound, a III-V compound, or a II-VI compound. Examples of suitable group IV elements or compounds include germanium, silicon germanium, and silicon carbide. Examples of suitable III-V compounds include gallium arsenide, gallium nitride, indium arsenide, indium antimonide, indium aluminum antimonide, indium aluminum arsenide, indium phosphide, and indium gallium arsenide. Examples of suitable II-VI compounds include zinc selenide and zinc oxide.

The second crystalline semiconductor material 410 may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The growth temperature in the chamber may range from about 300° C. to about 900° C., depending on the composition of the epitaxial region. The growth system may also utilize low-energy plasma to enhance the layer growth kinetics. CVD has a number of advantages, including the capability for depositing films with low defect densities and rapidly varying alloy compositions, as well as high quality regrowth capability. CVD may also provide improved manufacturability due to relatively higher throughput, relatively short downtimes, and scalability to very large reactors.

The epitaxial growth system may be a single-wafer or multiple-wafer-batch reactor. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or EPSILON single-wafer epitaxial reactors available from ASM International based in Bilthoven, The Netherlands.

Dislocation defects 415 in the second crystalline semiconductor material 410 reach and terminate at the sidewalls 420 of the window in the dielectric material 440 at or below a vertical predetermined distance H from the surface of the substrate, such that dislocations 415 in the second crystalline semiconductor material 410 decrease in density with increasing distance from the bottom portion of the window. Accordingly, the upper portion of the crystalline material 410 is substantially exhausted of dislocation defects 415. Various dislocation defects 415 such as threading dislocations, stacking faults, twin boundaries, or anti-phase boundaries may thus be substantially eliminated from the upper portion of the epitaxial region. A density of such dislocation defects 415 may be less than, for example, $10^6/cm^2$, preferably less than $10^3/cm^2$. The second crystalline semiconductor material 410 may be either substantially relaxed or strained.

A high-quality tunneling device 400 may be fabricated on top of the low-defect second crystalline semiconductor material 410. The tunneling device may be, for example, an RTD including GaAs and AlGaAs. The RTD device 400 may include multiple thin semiconductor layers 425 such as, from bottom to top, a relatively thick n-type layer 446 (e.g., n-type gallium arsenide with a thickness of, e.g., 10-25000 nm); an undoped layer 447 (e.g., undoped gallium arsenide with a thickness of, e.g., 0-50 nm); a thin barrier layer with a large bandgap 448 (e.g., undoped aluminum gallium arsenide with a thickness of, e.g., 0-50 nm); a thin two-dimensional resonant electron layer 449 (e.g., undoped gallium arsenide with a thickness of, e.g., 0-50 nm); another thin barrier layer with large bandgap 450 (e.g., undoped aluminum gallium arsenide with a thickness of, e.g., 0-50 nm); another undoped layer 451 (e.g., undoped gallium arsenide with a thickness of, e.g., 0-50 nm); and another relatively thick n-type layer 452 (e.g., n-type gallium arsenide, 10-25000 nm). All of these layers 425 may be grown epitaxially in sequence in any suitable epitaxial deposition system, including, but not limited to, MOCVD, APCVD, LPCVD, UHCVD, MBE, or ALD. This exemplary RTD device has two external contacts: a first contact 430 contacts the n-type layer 446, and a second contact 435 contacts the n-type layer 452. Both contacts 430 and 435 typically include metal contacts. The first contact 430 may be made by etching a small hole (not shown) on one side of the device to reach the layer 446. Methods and variations for the fabrication of this RTD 400 device will be apparent to one of skill in the art.

In the above examples, the layers 425 of the RTD include or consist essentially of AlGaAs and GaAs. Thus, the substrate may include a group IV element such as Si, and the RTD may include a III-V compound. In some embodiments, the RTD may include a II-VI compound.

Although only one exemplary RTD is illustrated in FIG. 4, embodiments of the invention also include other varieties of resonant tunneling device structures with a variety of semiconductor material combinations, layer structures, layer thicknesses, doping levels in each layer, epitaxy growth conditions (e.g., precursors, growth temperature, etc), and contact configurations.

For example, referring to FIG. 5, the layers 425 of RTD may include various combinations of pairs of III-V materials. The layers may include a heavily doped materials 1 layer 546, an undoped materials 1 (spacer) layer 547, an undoped materials 2 barrier layer 548, an undoped materials 1 (2D resonant electron layer) layer 549, a second undoped materials 2 barrier layer 550, an undoped material 1 spacer layer 551, and a heavily doped materials 1 layer 552, where materials 1/materials 2 combinations may be, e.g., GaAs/AlGaAs, GaAs/InGaAs, GaInAs/AlInAs, GaAs/AlAs, InP/InGaAs, InGaAs/AlAs, InAs/AlSb, or InSb/AlInSb. Other material systems may also be used. In addition, the two doped layers 546 and 552 may include different materials. The 2D resonant electron layer 549 may be undoped and may have a thickness of 5 nm, and the barrier layers 548, 550 may be undoped and may have a thickness of 1 to 5 nm. The doped layers 546 and 552 may be, e.g., n-type with a doping level of $2\times10^{18}$ to $1\times10^{19}/cm^3$.

Referring to FIGS. 6a and 6b, a contact to a tunneling device 400 may be formed by the following approach. The steps in this approach are also applicable to other tunneling devices and structures of other embodiments of the inventions described herein. In a first step, III-V heteroepitaxial layers 410 are grown selectively in a window 445 defined by a dielectric layer 440 disposed over a semiconductor substrate 405. Such dielectric windows may be utilized in some heteroepitaxial growth technologies such as ART technology. In a second step, the dielectric 440 is etched back, e.g., approximately halfway back to form a recess structure. The etch-back of the dielectric 440 partially exposes the layers 425 within the dielectric window, allowing, e.g., a first contact 430 to also be made to a bottom layer disposed in the dielectric window (e.g., to the doped layer 546 in FIG. 6b).

Figure 7A:
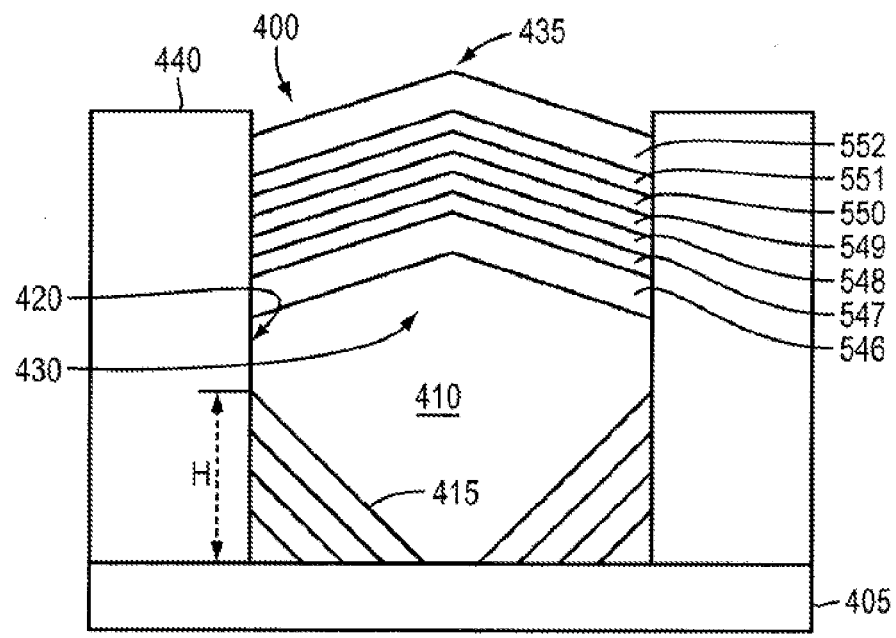
Figure 7B:
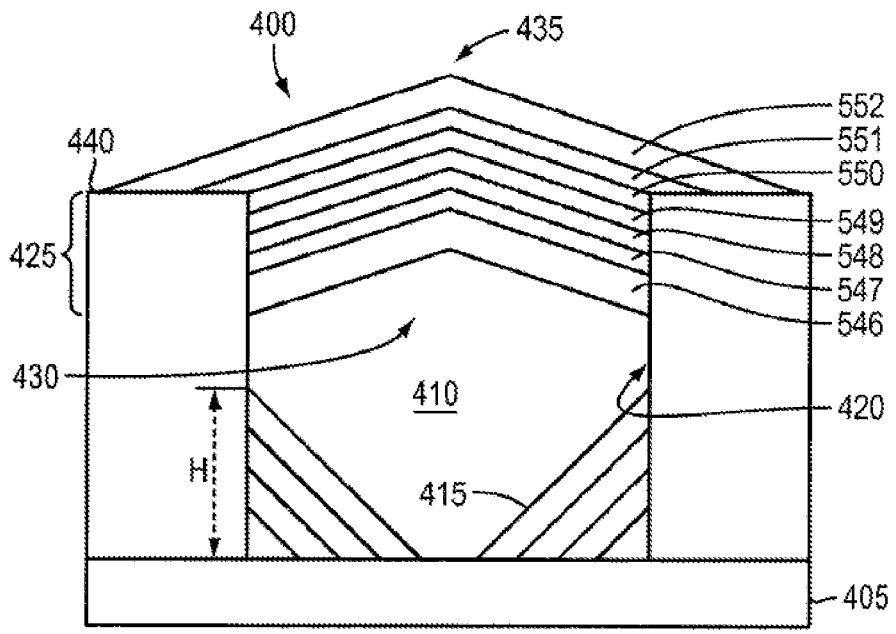

In most of the drawings discussed herein, the semiconductor epitaxial layers of the tunneling device structures are depicted with flat layers, for the sake of simplicity. Nevertheless, those drawings should also be considered to encompass structures with non-flat layers. One experimental sample of Ge material grown in silicon oxide windows on a Si substrate by ART technique illustrates that the surface of a semiconductor epitaxial layer is typically non-flat, due to faceting during the epitaxial growth. Therefore, the simplified illustrations such as FIG. 5 should be interpreted as including variations having non-flat epitaxial layers, as depicted in FIG. 7a. Another approach is depicted in FIG. 7b, where some layers 425 of the device structure are grown within the dielectric windows and are non-flat, while other layers are grown above the dielectric layer 440.

Referring to FIGS. 8a-8c, another embodiment of an epitaxial layer and device structure is formed as follows. In the first step, FIG. 8a, III-V material 410 is grown within and above dielectric windows 445 by ART technique, this III-V material 410 having a non-flat surface due to faceting. In the second step, FIG. 8b, the structure is planarized to achieve a flat surface, for example by CMP using the dielectric layer 440 as a polishing stop. In the third step (FIG. 8c), epitaxial device layers 425 are grown on the flat surface. Contacts to both doped layers 546 and 552 may be made, by, e.g., first and second contacts 430 and 435, as shown in FIG. 8c, as both doped layers 546 and 552 are disposed above the dielectric layer 440 and are at least partially exposed.

Although only one exemplary device structure is illustrated in both FIGS. 7 and 8a-8c, these approaches and methods are also applicable to other tunneling devices and structures of other embodiments of the inventions described herein.

In addition to the basic RTD structures discussed above, some other exemplary tunneling devices are further described below. In some embodiments, the structures described below may be fabricated on III-V or II-VI epitaxial layers that are grown selectively on conventional substrates such as Si, SOI, or SSOI substrates in selected areas (such as the device active area). Such layers may be formed by heteroepitaxy, such as with ART techniques.

Figure 9:
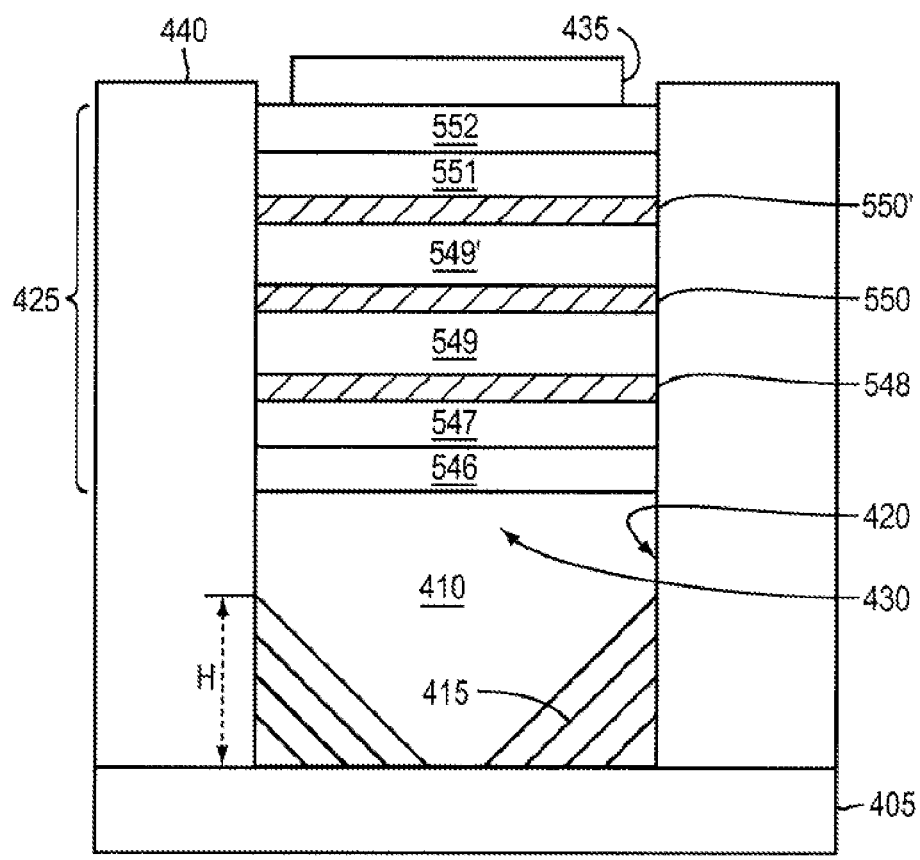
FIG. 9 is a cross-sectional view of a triple-barrier RTD formed with the use of ART in accordance with an embodiment of the invention.

Referring to FIG. 9, a triple-barrier tunneling diode includes three barriers 548, 550, 550' and two 2D resonant electron layers 549, 549'. This structure gives rise to multiple current peaks on I-V characteristics. A multiple-barrier tunneling diode may be formed by incorporating more than three barrier layers separating multiple 2D resonant electron layers (not shown).

Typical RTDs are often intra-band tunneling diodes. A variation of a tunneling diode is the RITD device. FIGS. 10a-10e illustrate five different RITD structures 1000. In each example, the III-V epitaxial layers 410, e.g., n$^+$-InAs, are grown on a semiconductor substrate 405, e.g., an Si wafer, in the device area by heteroepitaxy. Referring to FIG. 10a, an RITD 1000 may include an ohmic contact 1005 and an injecting junction 1010 that is a polytype heterostructure, i.e., including a barrier layer 1020, 1020' (e.g., i-AlSb layer having a thickness selected from a range of about 1.5 nm to 3 nm) inserted in a type-III (or so-called broken-gap) heterojunction, including e.g., a p-GaSb layer 1030 and an n-InAs layer 1040. Referring to FIG. 10b, an RITD 1000 may include a type-III (or broken-gap) heterojunction including, e.g. a p-GaSb layer 1030 and an n-InAs layer 1040.

Referring to FIG. 10c, an RITD 1000 may include two delta-doped layers $\delta n^+$, and $\delta p^+$ 1050, 1060. The delta-doped layer sheet charges are typically on the order of $1\times10^{13}/cm^2$. With delta-doped layers 1050, 1060, a single material may be used to make the diode, e.g., intrinsic 1061 and p$^+$ doped 1062. Referring to FIG. 10(d), an RITD 1000 may include three delta-doped layers, e.g., $\delta n^+$, $\delta p^+$, and $\delta n^+$ 1050, 1060, 1050', between two intrinsic layers 1061 and an n$^+$ layer 1063. Referring to FIG. 10(e), an RITD 1000 may include a double-quantum-well heterostructure with layers including, e.g., n$^+$-InAlAs 1070, i-InGaAs 1075, i-InAlAs 1080, i-InGaAs 1085, and p$^+$-InAlAs 1090.

One advantage of RITDs is a high peak-to-valley current ratio (PVCR). Among the illustrated devices, the RITD 1000 with double-quantum-well heterostructure (FIG. 10(e)) exhibits the highest PVCR.

Figure 11:
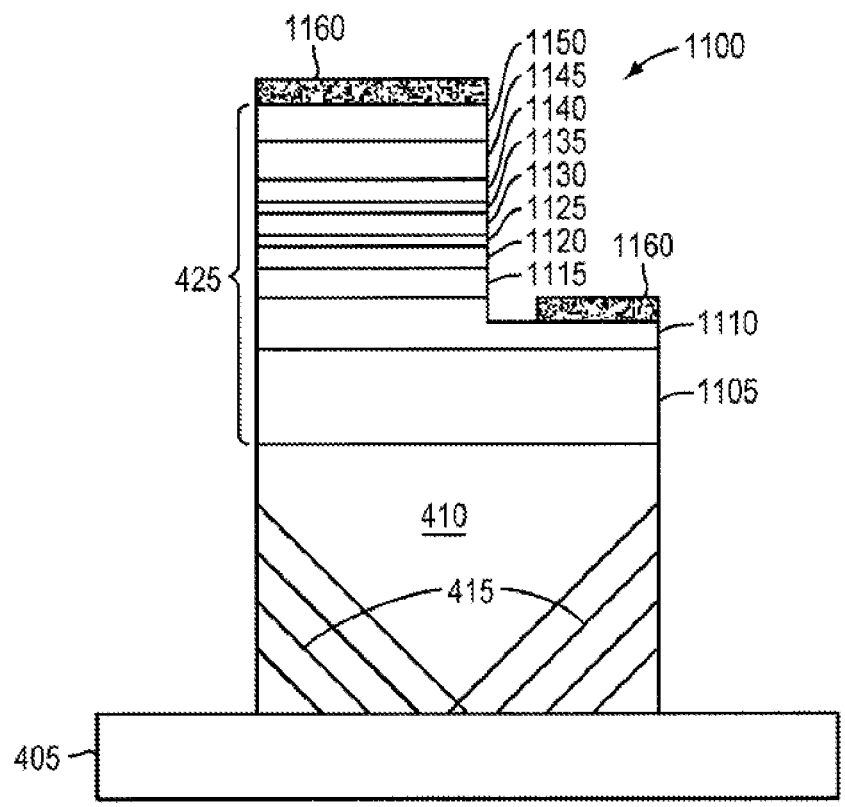
FIG. 11 is a cross-sectional view of a magnetic resonant tunneling diode as a spin selector for spintronic applications in accordance with an embodiment of the invention.

Referring to FIG. 11, an example of a magnetic resonant tunneling diode 1100 as a spin selector for spintronics applications is illustrated. It is fabricated in two phases. The first phase includes heteroepitaxy growth of a buffer layer 410 of either GaAs or ZnBeSe material using ART techniques to achieve high-quality low defect material. The second phase includes fabricating a typical magnetic resonant tunneling diode 1100. The magnetic resonant tunneling diode 1100 includes layer structure 425 that may include, for example, $Zn_{0.97}Be_{0.03}Se$ layer (300 nm thick, n-type doping at $8\times10^{18}/cm^3$) 1105, a first ZnSe layer (100 nm thick, n-type doping at $1.5\times10^{19}/cm^3$) 1110, $Zn_{0.97}Be_{0.03}Se$ layer (10 nm thick, n-type doping at $1\times10^{18}/cm^3$) layer 1115, a second ZnSe (10 nm, intrinsic) layer 1120, $Zn_{0.7}Be_{0.3}Se$ layer (5 nm thick, intrinsic) 1125, $Zn_{0.96}Mn_{0.04}Se$ layer (9 nm thick, intrinsic) 1130, $Zn_{0.7}Be_{0.3}Se$ layer (5 nm thick, intrinsic) 1135, a third ZnSe layer (10 nm thick, intrinsic) 1140, $Zn_{0.97}Be_{0.03}Se$ layer (15 nm thick, n-type doping at $1\times10^{18}/cm^3$) 1145, and a fifth ZnSe layer (30 nm thick, n-type doping at $1.5\times10^{19}/cm^3$) 1150. Metal contacts 1160 are formed to the first ZnSe layer 1110 and the fifth ZnSe layer 1150. With magnetic Mn incorporated into the quantum well material in the magnetic resonant tunneling diode 1100, a strong splitting of well resonance is obtained as a function of external magnetic field. The device 400 can thus be used as a spin selector.

Referring to FIGS. 12 to 17, besides various 2-terminal tunneling diodes, a number of 3-terminal transistor devices incorporate quantum tunneling structures. The advantages of 3-terminal tunneling devices over the 2-terminal tunneling diodes may include: (i) providing a high-speed tunable negative differential resistance/transconductance, and (ii) providing isolation between the input and output.

Referring to FIGS. 12a-12b, an exemplary fabrication process for forming an RTFET on ART semiconductor material is as follows. Multiple layers 425 are grown by heteroepitaxy, e.g., by an ART process, to form a quantum tunneling device structure 400. The fabrication process and materials used may be similar to those discussed with respect to FIG. 5, and include a source 1200 and a drain 1205. The dielectric layer 440 is at least partially etched back, e.g., halfway, and then a gate structure 1210 is formed to control the device. The gate 1210 is typically either a metal contact (Schottky diode), or a p-n junction. The function of the gate is to control the depletion width to vary the net cross-section area of the diode.

Devices may have one of two types of gate structures. In a two-sided gate structure, the gate material may form on two opposite sides of the diode, resulting in a 1-D resonant-tunneling device, or quantum wire device. In a four-sided gate structure, the gate material may form around all sides of the diode, resulting in a 0-D resonant-tunneling device, or quantum dot (or single-electron) transistor.

Figure 13B:
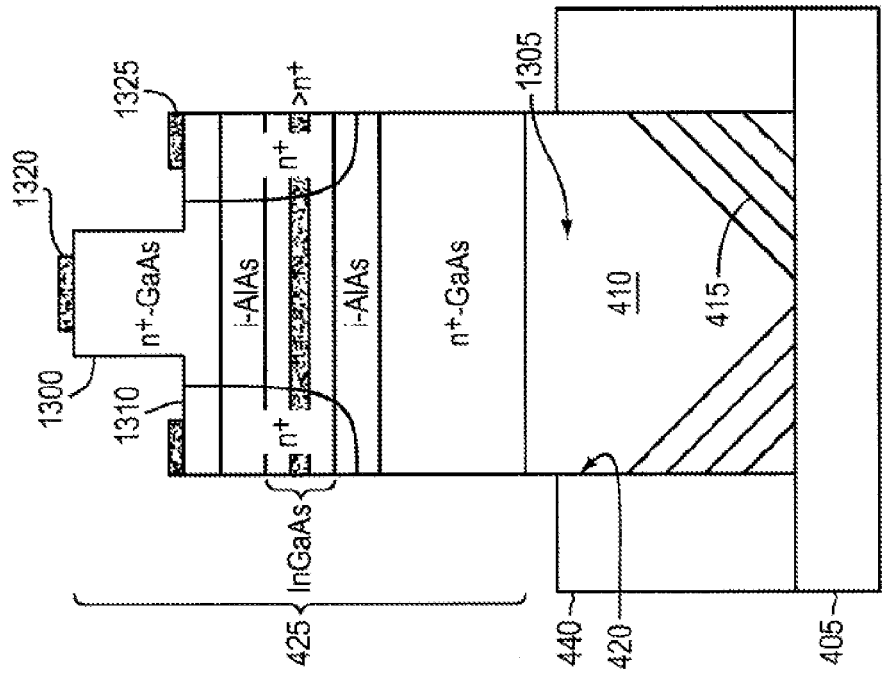
FIGS. 13a-13b are cross-sectional views of a QWBRTT formed with the use of ART in accordance with an embodiment of the invention.
Figure 13A:
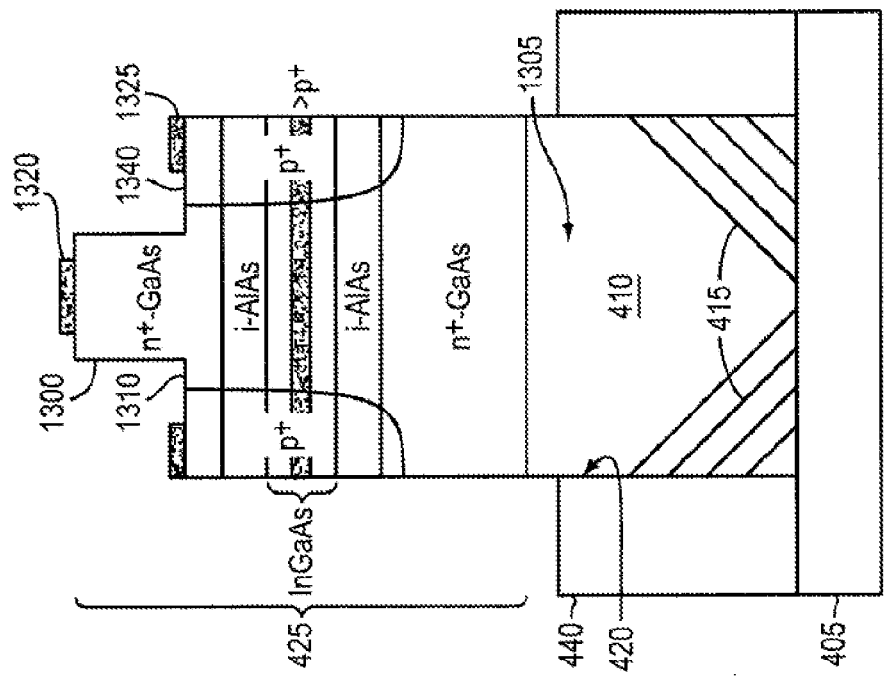

Referring to FIGS. 13a-13b, a QWBRTT is an ultrafast device in which carrier conduction from an emitter 1300 to a collector 1305 takes place via a tunneling structure. It is essentially an RTD device with a third terminal (a base) 1310 that contacts the quantum well to control its potential. Two types of QWBRTT include a bipolar device with p-type base that has a doping type (e.g., p-type) opposite to that of the emitter 1300 and the collector 1305 (e.g., n-type) (FIG. 13a), and a unipolar device with an n-type base that has a doping type (e.g., n-type) that is the same as the emitter 1300 and collector 1305 (e.g., n-type) (FIG. 13b). Terminals for an emitter contact 1320 and a base contact 1325 are provided.

Referring to FIGS. 14a-14c, an RTBT or RBT integrates a tunneling quantum structure within a bipolar transistor. Three exemplary structures vary by the location of where the quantum tunneling structure is incorporated.

Referring to FIG. 14a, an RTBT structure may include a tunneling quantum structure in the base 1310 region. Its energy band diagram is shown. As illustrated, a GaAs material system may be used; another exemplary material system is GaInAs/AsInAs. Referring to FIG. 14b, an RTBT structure may include a tunneling quantum structure at the base-emitter junction. Referring to FIG. 14c, an RTBT structure may include a tunneling quantum structure in the emitter 1300 region.

Figure 15:
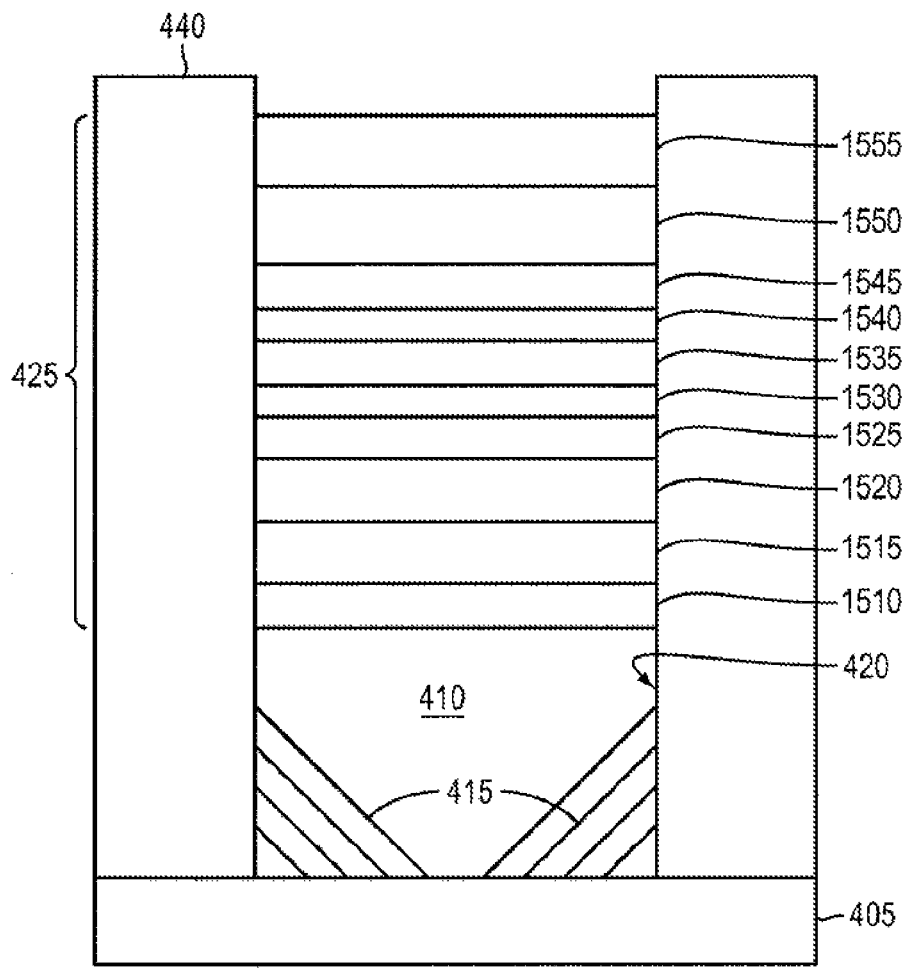
FIG. 15 is a cross-sectional view of a three-terminal bipolar quantum resonant tunneling transistor formed over GaAs grown by ART on a Si substrate in accordance with an embodiment of the invention.

Referring to FIG. 15, a three-terminal bipolar quantum RTT may be disposed over lattice-mismatched material 410, e.g., GaAs, formed by ART growth on a substrate 405. This bipolar quantum resonant tunneling transistor operates in a manner similar to a conventional bipolar transistor; the tunneling current may be controlled by modulating the potential inside a quantum well that functions as a base. The fabrication process has two phases. In the first phase, a second semiconductor material 410 (e.g., GaAs) is grown in a window 445 on a Si substrate 405 using ART. In the second phase, multiple layers 425 of GaAs and AlGaAs quantum wells are grown epitaxially on this structure. These QWs may be formed by typical processes familiar to those of skill in the art, and may include, e.g., the following layers: GaAs buffer 410 formed on Si substrate 405 by ART, undoped GaAs 1510 (1 μm thick); contact layer 1515 of GaAs (2 μm thick, Si-doped to $2\times10^{18}/cm^3$); supperlattice collector 1520 (50 periods of 8 nm GaAs and 2 nm of AlGaAs Si-doped to $2\times10^8/cm^3$), 3 periods of the same superlattice 1525 (8 nm GaAs and 2 nm AlGaAs, undoped), tunnel barrier 1530 (5 nm undoped AlGaAs), quantum well 1535 (15 nm with center 5 nm Be-doped to $1\times10^{19}/cm^3$), tunnel barrier 1540 (5 nm undoped AlGaAs), 3 periods of the same superlattice 1545 (8 nm GaAs and 2 nm AlGaAs, undoped), supperlattice collector 1550 (50 periods of 8 nm GaAs and 2 nm of AlGaAs Si-doped to $2\times10^{11}/cm^3$), and contact layer 1555 (2 μm GaAs, Si-doped to $2\times10^{18}/cm^3$).

Figures 16A, 16B:
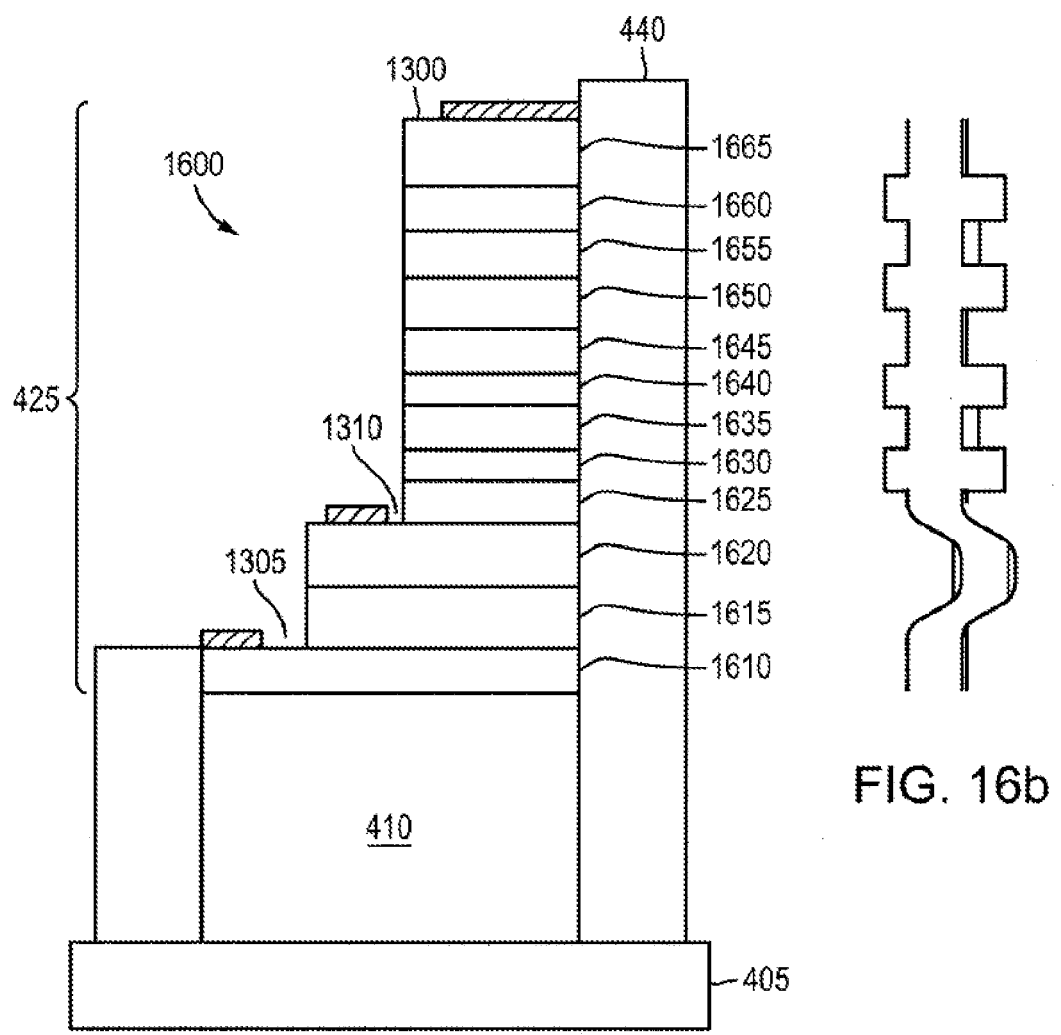

Referring to FIG. 16a, a multi-state RTBT 1600 may include a stack of two $Al_{0.48}In_{0.52}As$ (5 nm)/$Ga_{0.47}In_{0.53}As$ (5 nm)/$Al_{0.48}In_{0.52}As$ (5 nm) resonant tunneling double barrier structures incorporated into the emitter 1300 region of a $Ga_{0.47}In_{0.53}As$ n-p-n transistor. Its corresponding energy band diagram is shown in FIG. 16b. This multi-state RTBT exhibits multiple negative differential resistance and transconductance characteristics.

The emitter 1300 of RTBT 1600 includes $n^+$ layer 1610 (GaInAs, 5000 angstroms), n-type layer 1615 (GaInAs, 3000 angstroms), $p^+$ layer 1620 (GaInAs, 3000 angstroms), n-type layer 1625 (GaInAs, 500 angstroms), undoped layer 1630 (AlInAs, 50 angstroms), undoped layer 1635 (GaInAs, 50 angstroms), undoped layer 1640 (AlInAs, 50 angstroms), $n^+$ layer 1645 (GaInAs, 1000 angstroms), undoped layer 1650 (AlInAs, 50 angstroms), undoped layer 1655 (GaInAs, 50 angstroms), undoped layer 1660 (AlInAs, 50 angstroms), and $n^+$ layer 1665 (GAInAs, 5000 angstroms). Undoped layers 1660, 1655 and 1650 form one tunneling structure, and undoped layers 1640, 1635 and 1630 form a second tunneling structure.

Figures 17A, 17B:
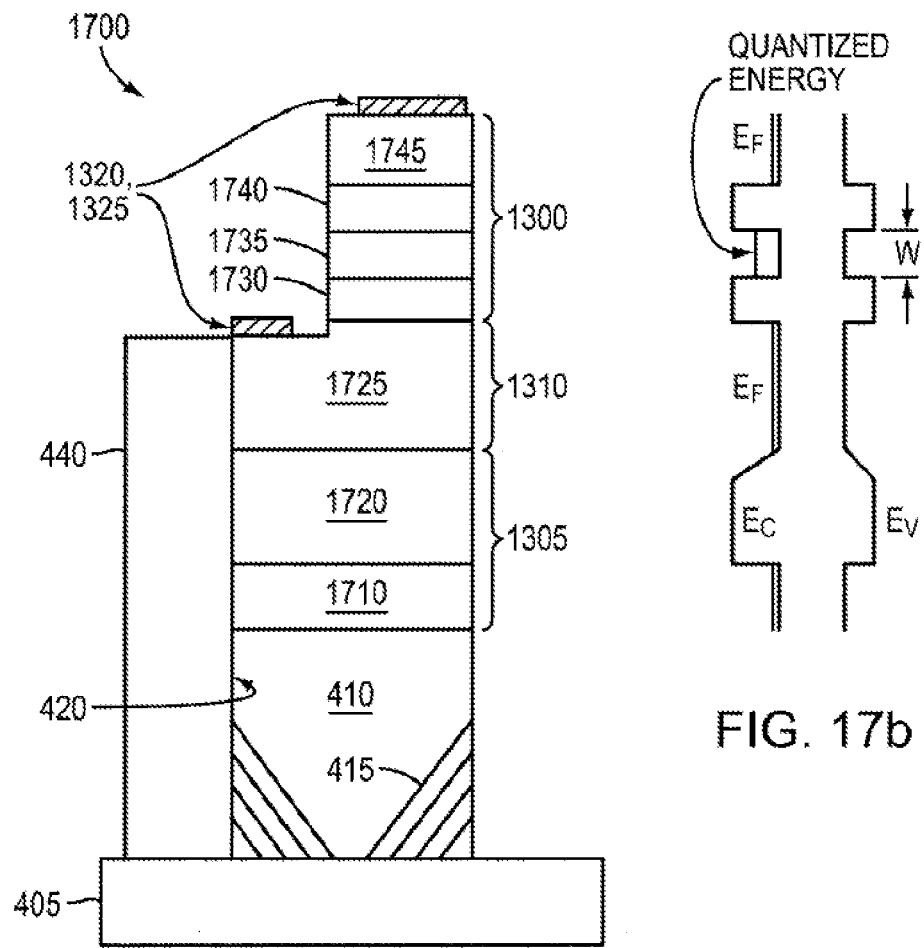
FIGS. 17a-17b are a cross-sectional view of an RHET formed by ART and its energy-band diagram in accordance with an embodiment of the invention.

Referring to FIG. 17, an RHET 1700 incorporates a tunneling diode structure between the emitter 1300 and the base 1310 regions. This figure shows an exemplary RHET on a heteroepitaxial layer 410 grown on Si, and its energy-band diagram. One distinct characteristic is that the RHET has heavily doped emitter 1300 and base 1310 regions, except for the AlGaAs/GaAs/AlGaAs tunneling diode region layers in the lower portion of emitter 1300. It combines resonant tunneling with hot-electron ballistic transport in the base, resulting in super high speed. More specifically, the RHET includes a GaAs buffer layer 410 formed by heteroepitaxy, a collector 1305 including $n^+$-GaAs 1710 and i-AlGaAs 1720, a base 1310 including $n^+$-GaAs 1725, and an emitter 1300 including i-AlGaAs 1730, i-GaAs 1735, i-AlGaAs 1740, and $n^+$-GaAs 1745.

Figure 18:
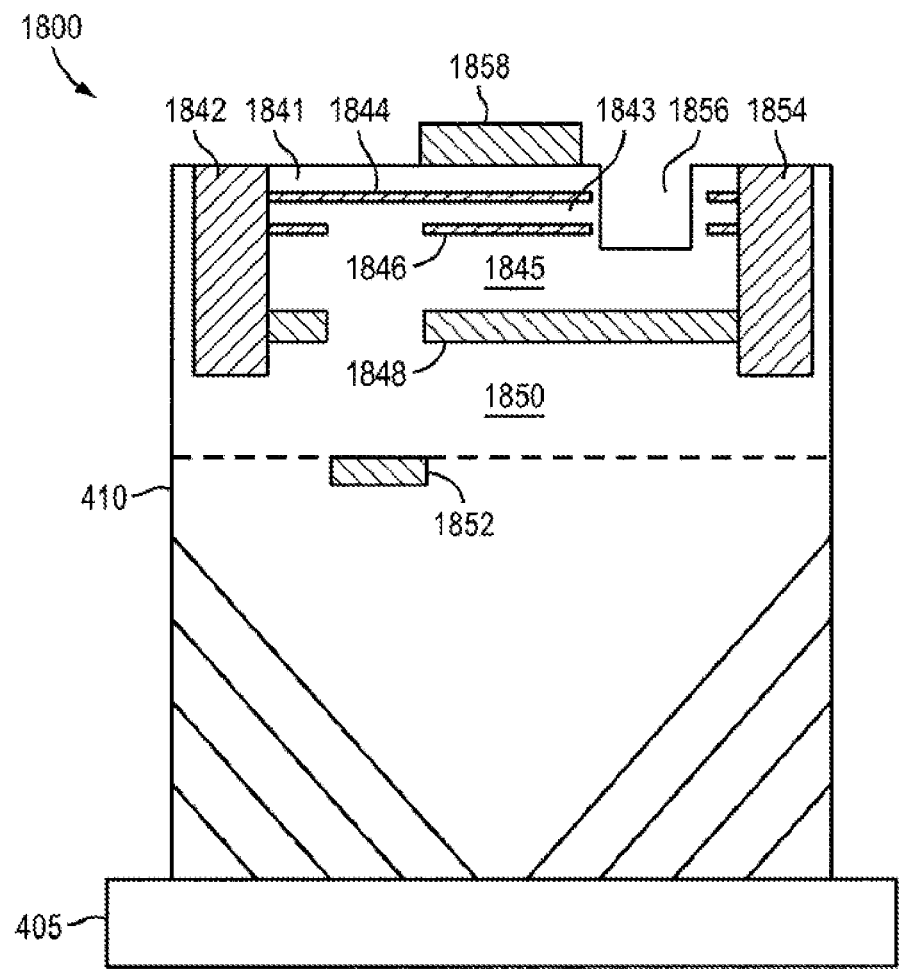
FIG. 18 is a cross-sectional view of a typical DELTT structure disposed over GaAs material formed by ART in accordance with an embodiment of the invention.

Referring to FIG. 18 a DELTT structure 1800 may be disposed over lattice-mismatched material, e.g., GaAs region 410. The GaAs region 410 is formed by ART growth on a substrate 405. An AlGaAs region 1850 is formed above the GaAs region 410. In this example, GaAs is used as narrow bandgap material and AlGaAs is used as wide bandgap material. Other narrow/wide bandgap material systems may be also used to fabricate DELTT devices in a similar manner.

In an exemplary fabrication process, a dielectric layer over a semiconductor substrate is patterned to define a window for the DELTT region. Other devices, such as CMOS devices, may be fabricated on another region of the substrate. In the DELTT region, undoped GaAs is epitaxially grown by ART techniques, such that a top portion of the GaAs is substantially defect-free. Next a DELTT device is fabricated on top of the GaAs by, for example, a typical fabrication process such as that described in U.S. Pat. No. 5,825,049, FIGS. 6A-8D. The DELTT device may include the following features: a metal emitter contact 1842, a metal collector contact 1854, a two dimensional quantum well emitter layer 1844 electrically contacting the emitter contact 1842, a two dimensional quantum well resonant tunneling layer 1846 (e.g., about 7 nm of GaAs), a collector layer 1848 disposed opposite the resonant tunneling layer 1846 from the emitter layer 1844 (e.g., a 15 nm thick, 2-dimensional emitter layer for electrons), the collector layer 1848 electrically contacting the collector contact 1854, a first barrier layer 1845 (e.g., including two layers including a 20-30 nm GaAs voltage drop layer over the collector layer 1848 and a 5 nm AlGaAs wide bandgap barrier layer under the resonant tunneling layer 1846) disposed between the collector layer 1848 and the resonant tunneling layer 1846, a second thin tunneling barrier layer 1843 (e.g., a 7.5 nm AlGaAs layer) disposed between the resonant tunneling layer 1846 and the emitter layer 1844. The device may also include a back gate 1852 formed by implantation, an insulator 1860 (60 nm), an opening 1856 for insulation, and a metal control gate 1858. At least some of these features may also include GaAs. Thus, the substrate may include a group IV element such as Si, and the DELTT device may include a III-V compound. In some embodiments, the DELTT device may include a II-VI compound.

The various transistor structures illustrated in FIGS. 13a-18 show three terminal devices (i.e., a transistor with terminals for the base, emitter, and collector) that include a tunneling structure and in which ART techniques are used to trap defects.

II. Integrated Circuit Units with Tunneling Devices and Conventional Devices

Functional circuit units may incorporate both quantum tunneling devices, such as those described above, and conventional Si-based devices such as a MOSFET, MESFET, or conventional III-V-based device such as a HEMT, etc., to form a hybrid system. Such circuit units may function as, e.g., a logic circuit, an amplifier, an SRAM or a DRAM, a microprocessor, etc.

Figure 19:
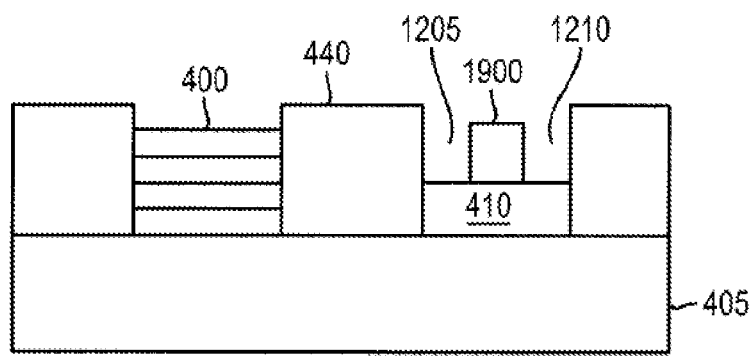
FIG. 19 is a cross-sectional view of a building block for various logic circuit units in accordance with an embodiment of the invention.

A generic integrated circuit building block is disclosed in FIG. 19, a structure where tunneling devices are a building component for a variety of logic circuitry units. The tunneling device and/or the conventional device may be formed over desirable III-V or II-VI semiconductor material structures grown on common semiconductor substrates by ART techniques.

Referring to FIG. 19, a structure including tunneling devices may be used as a building block for a variety of logic circuitry units. An exemplary generic logic circuit building block includes at least one tunneling device(s) 400 (e.g., RTD, RTT, RITD, RTFET, QEBRTT, RTBT, RHET, DELTT, etc.) and at least one conventional device(s) 1900 (e.g., MOSFET, MISFET, HEMT, etc.). Either or both of the tunneling device 400 and the conventional device 1900 may be formed over semiconductor material 410 grown on Si substrate 405 by ART techniques. The tunneling devices 400 may be fabricated in accordance with the fabrication process described above, or other exemplary devices discussed above. The conventional device may be fabricated in accordance with typical processes. An exemplary fabrication process may include fabricating a quantum tunneling device structure after the typical front-end process for a conventional Si-based CMOS process, but before the typical back-end process of the conventional Si-based CMOS process. Other similar processes may be also used for device and circuit fabrication.

Such monolithic integration of conventional devices with high-speed tunneling devices enable the formation of high-speed logic circuits by increasing output drive current levels, logic fan-out, and output-to-input isolation, etc, while reducing both the power consumption and the number of devices used in the circuit. This hybrid circuit unit, fabricated on Si or other common substrates using ART techniques, may be used as a building block for various functional logic circuitry for various applications, such as digital logic, mixed signal, analog, etc. Several examples are illustrated below. Embodiments of the invention are not limited to those exemplary circuits, and may include other types of circuit units or circuit systems.

Example 1

Figure 20A:
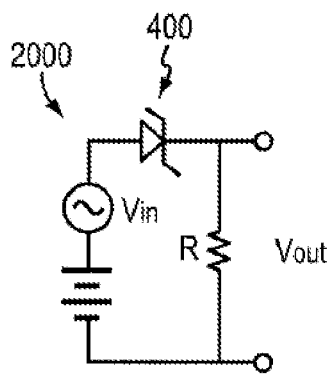
FIGS. 20a-20c and 21 are diagrams illustrating circuit units incorporating RTD formed by ART in accordance with embodiments of the invention.
Figure 20B:
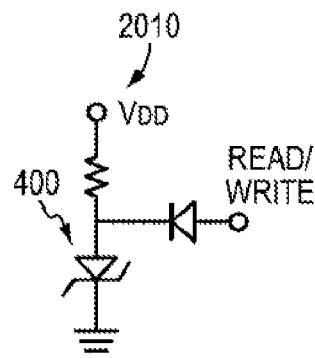
Figure 20C:
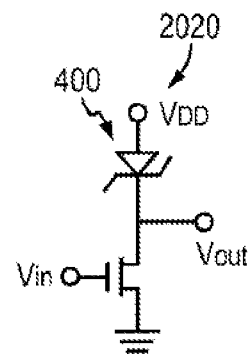

Referring to FIGS. 20a-20c, basic circuit units may incorporate an RTD fabricated on III-V epitaxy layers grown on Si. Alternatively, other types of tunneling diodes may also be used, such an RITD. Referring to FIG. 20a, an exemplary circuit unit 2000 includes an amplifier that provides an AC voltage gain. Referring to FIG. 20b, another exemplary circuit unit 2010 includes a simple memory cell comprising one RTD. The negative differential resistance of an RTD gives rise to two bi-stable operating states that enable a memory function. Referring to FIG. 20c, yet another exemplary circuit unit 2020 includes a logic inverter.

Example 2

Figure 21:
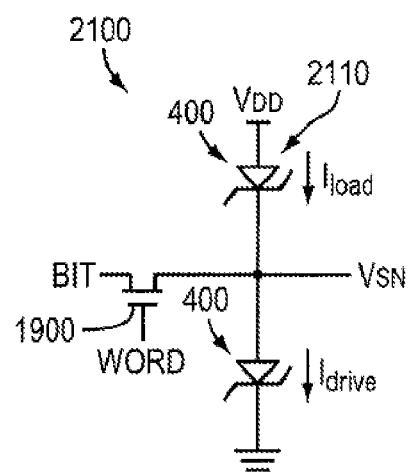
Figure 22:
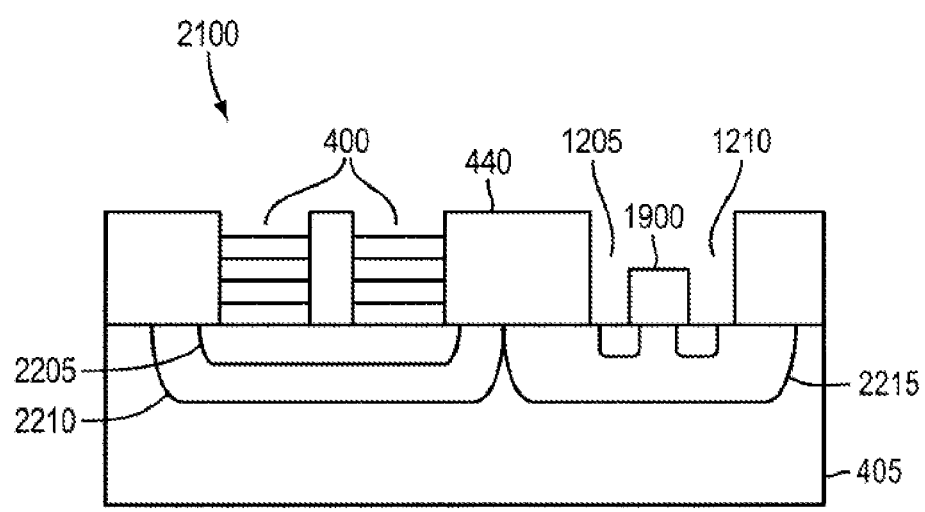
FIG. 22 is a cross-sectional view of an SRAM structure including two RTDs and an n-FET in accordance with another embodiment of the invention.
Figure 25:
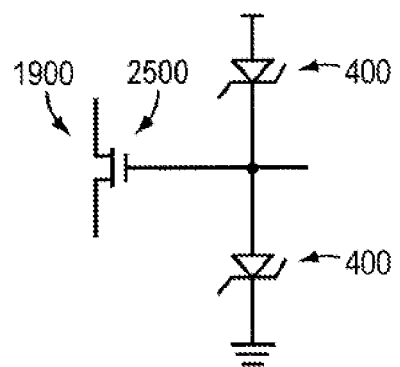

Referring to FIG. 21, two RTDs 400 and one MOSFET 1900 may be integrated to form an SRAM (TSRAM) 2100 with III-V heteroepitaxial layers on Si. This circuit unit SRAM 2100 may be constructed with the structure illustrated in FIG. 22, where two RTD (or RITD) devices are integrated on a semiconductor substrate 405 with a conventional n-MOSFET 1900 to construct an SRAM memory cell unit. The RTD or RITD devices may be fabricated in a process flow using ART techniques. The two RTD devices may be connected in series by an underlying doped region 2205, e.g., a p+ Si region defined by implantation. Both RTD devices may be disposed over an n-well 2210 that is electrically isolated from an adjacent p-well 2215 underlying the n-FET. Interconnections (not shown) may be defined between the n-FET and the two RTD devices to form SRAM memory cell unit. The resulting structure illustrated in FIG. 22 show two tunneling structures (in the two RTDs) formed via ART and coupled to a MOSFET 1900, which as illustrated in FIGS. 23, 24 and 25 can be coupled to a terminal (gate, source, or drain) of the transistor.

Such a SRAM memory cell has two stable operation points that are substantially the same as those illustrated in FIG. 3. One may arrange multiple SRAM memory cells together within one chip to form a large scale SRAM array.

Because fewer devices are used in the SRAM memory cell unit (see FIG. 21) in comparison to conventional six-transistor SRAM units, and also due to the small footprint of RTD devices that can be made much smaller than a MOSFET, this novel hybrid SRAM unit 2100 may provide a 3 to 5 times area reduction compared to the conventional six-transistor SRAM. It is refresh-free and has fast read and write. Its low-voltage operation and low leakage current enable it to serve as a low power solution. It may also be used to replace the conventional DRAM function.

In summary, this exemplary RTD-based SRAM has the following features:
about 3-5× area reduction in comparison to a conventional 6-transistor SRAM (the size of RTD can be much smaller than that of a conventional transistor);
refresh free;
fast read and write; and
low voltage operation.

In the example of FIG. 21, a load 2110 of the memory cell is another RTD device. Alternatively, a resistor or a conventional MOSFET can serve as a load as well. Various exemplary alternative binary T-SRAM configurations 2300 are illustrated in FIGS. 23a-23e.

In the examples of FIG. 21 and FIGS. 23a-23e, the SRAM logic is binary logic. RTDs can also be used to construct multi-valued SRAM unit as well. Referring to FIGS. 24a-24e, various exemplary alternative multi-valued T-SRAM cell configurations 2400 include two or more RTDs connected in series to realize multi-value logic.

In comparison to conventional SRAM circuits that typically use six transistors, when forming transistors of a given gate length, SRAM circuits according to FIGS. 21-24, i.e., incorporating RTD(s) with transistors may be implemented in at least about a 33% smaller cell area and typically in a cell area at least 50% smaller than the area required for conventional SRAM circuits. In other words, the RTD-based SRAM cell area is at least 33% smaller than a surface area of an SRAM circuit constructed using six transistors having the same gate length as the transistor in the RTD-based SRAM cell area.

Referring to FIG. 25, as a variation of the memory cell of FIG. 21, two RTDs 400 are connected to the gate 2500 of the MOSFET 1900, instead of connected to the drain as in the case of FIG. 21. This circuit also functions as a memory cell.

Figure 26:
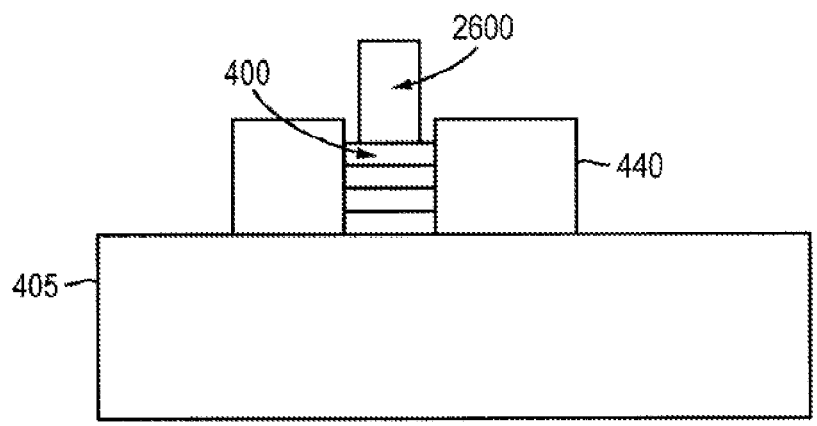
FIG. 26 is a cross-sectional view of a non-volatile memory cell including an RTD and one memory storage material (such as phase change material or ferroelectric material) in accordance with another embodiment of the invention.

Referring to FIG. 26, a memory cell unit may include a tunneling device 400 with a memory storage film 2600 disposed thereover. The memory storage film may be a phase change material film, i.e., a phase change layer. In an alternative embodiment, the memory storage film may include a ferroelectric material film.

Figure 27:
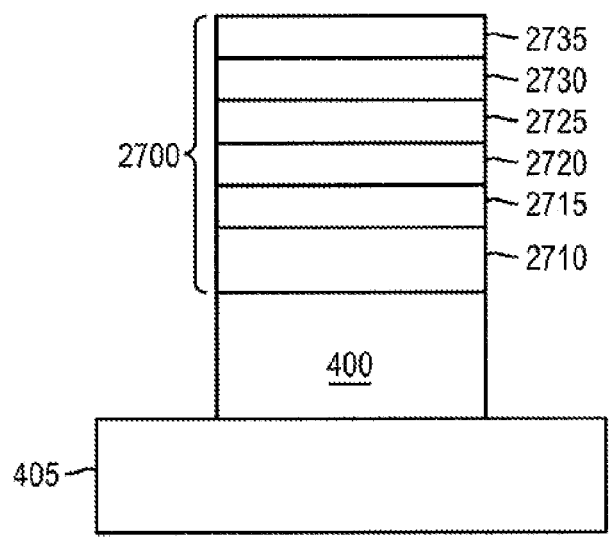
FIG. 27 is a cross-sectional view of a non-volatile magnetic random access memory including an RITD and a magnetic tunneling structure in accordance with another embodiment of the invention.

Referring to FIG. 27, a non-volatile RITD/magnetic random access memory (RITD/MRAM) may include (1) an RITD device 400 fabricated in a window in a dielectric layer (not shown), and (2) a tunneling structure or magnetic tunnel junction (MTJ) 2700 disposed directly on top of the RITD. MTJ 2700 has, from bottom to top, an anti-ferromagnetic exchange bias layer 2710, a magnetic pinned layer 2715, a Ru spacer layer 2720, another magnetic pinned layer 2725, a tunnel barrier layer 2730, and a magnetic free layer 2735. The MTJ 2700 structure may include a conventional MRAM memory cell structure, and may have different variations By stacking more than one MTJ in series in this structure, the memory cell can have multi-value memory function.

Another memory example includes a non-volatile memory cell including an RITD and a phase change chalcogenide resistor memory storage unit. By connecting a chalcogenide resistor as the load for the RITD, this memory cell may be used to realize a smaller multi-valued RAM memory. A typical chalcogenide resistor material is GeSbTe.

In the manner described above, various memory circuitry, such as SRAM circuitry, DRAM circuitry, and non-volatile memory circuitry, may be fabricated incorporating RTDs.

Example 3

Figure 28:
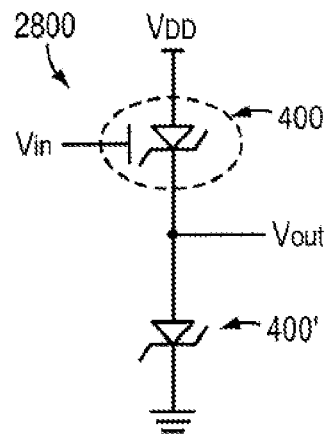
FIG. 28 is a diagram of a monostable-bistable transition logic element including an RTD formed by RTD in accordance with an embodiment of the invention.

Referring to FIG. 28, another basic circuit unit, a monostable-bistable transition logic element (MOBILE) 2800, has an edge-trigger and latching characteristics and can be used to build circuit units. For example, it can be used as an inverter. This circuit unit uses either two three-terminal resonant tunneling transistors 400, 400' or one two-terminal RTD and one three-terminal resonant tunneling transistor 400, 400'. For example, a first RTD 400 may have a controlled gate, such as a RTFET, an RTBT/RBT or a RHET. The second RTD 400' may or may not have a control gate. For detailed structure of three-terminal resonant tunneling transistor, refer to, for example, structures in I (Individual Devices).

Example 4

Figure 29:
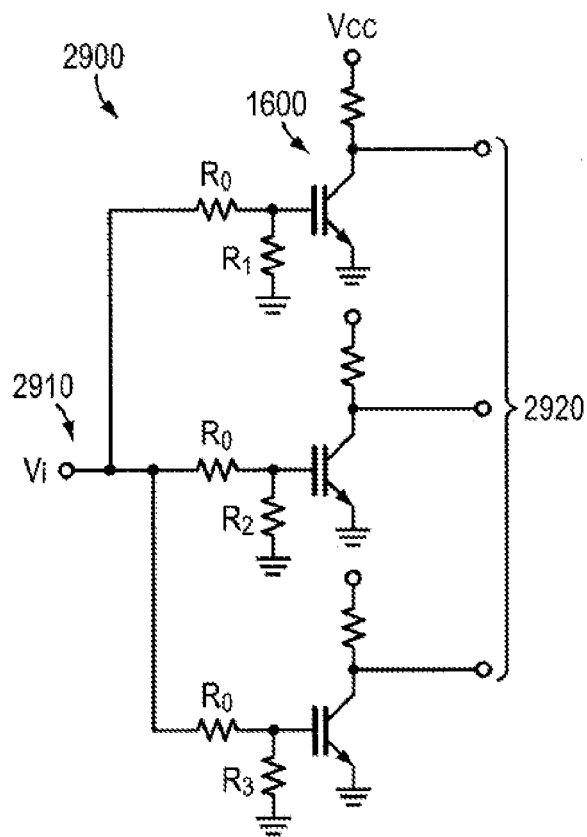
FIG. 29 is a diagram of an analog-to-digital converter circuit employing multi-state RTBT devices formed by ART in accordance with an embodiment of the invention.

Referring to FIG. 29, an exemplary analog-to-digital converter circuit 2900 with an analog input 2910 and a binary output 2920 employs multi-state RTBT devices 1600, rather than standard RTBT devices, with an analog input 2910. For more details regarding the structure of three-terminal multi-state RTBT devices, refer to FIG. 16.

Example 5

Figure 30:
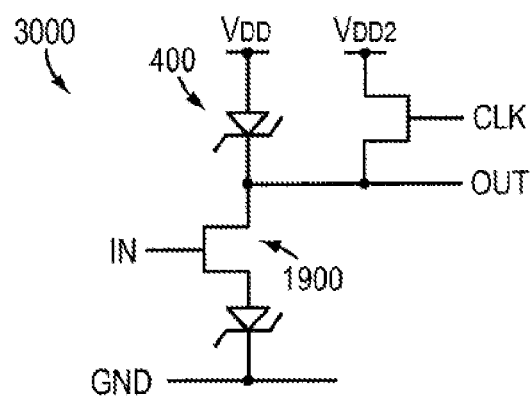
FIG. 30 is a diagram of a RTD/HEMT comparator incorporating an RTD into a HEMT formed by ART in accordance with an embodiment of the invention.

Referring to FIG. 30, an exemplary RTD/HEMT comparator 3000 incorporates an RTD 400 into a HEMT 1900. This comparator can significantly reduce the number of devices used in a circuit, reduce power consumption, and increase speed, compared to a conventional HEMT-based comparator.

Example 6

Figure 31:
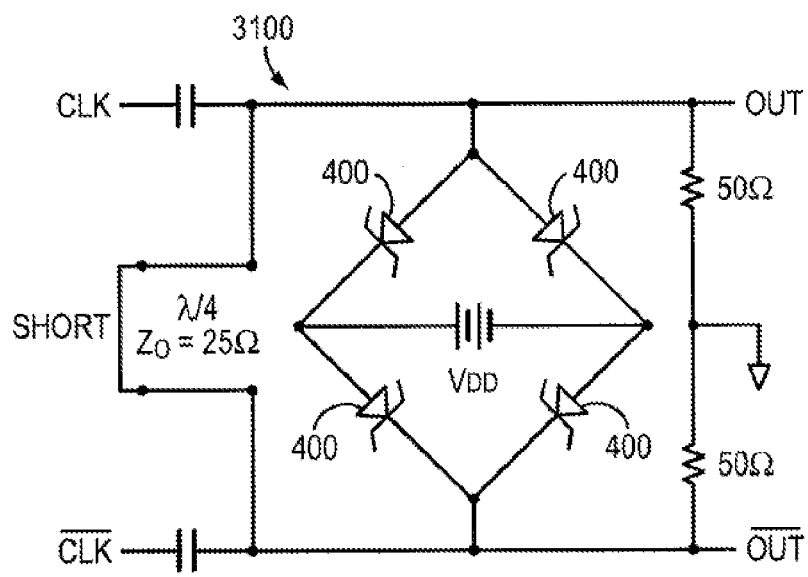
FIG. 31 is a diagram of an RTD-based clock generator formed by ART in accordance with an embodiment of the invention.

Referring to FIG. 31, an exemplary RTD-based clock generator 3100 allows a great reduction in the number of devices used in the circuit by employing RTDs 400.

Example 7

Figure 32:
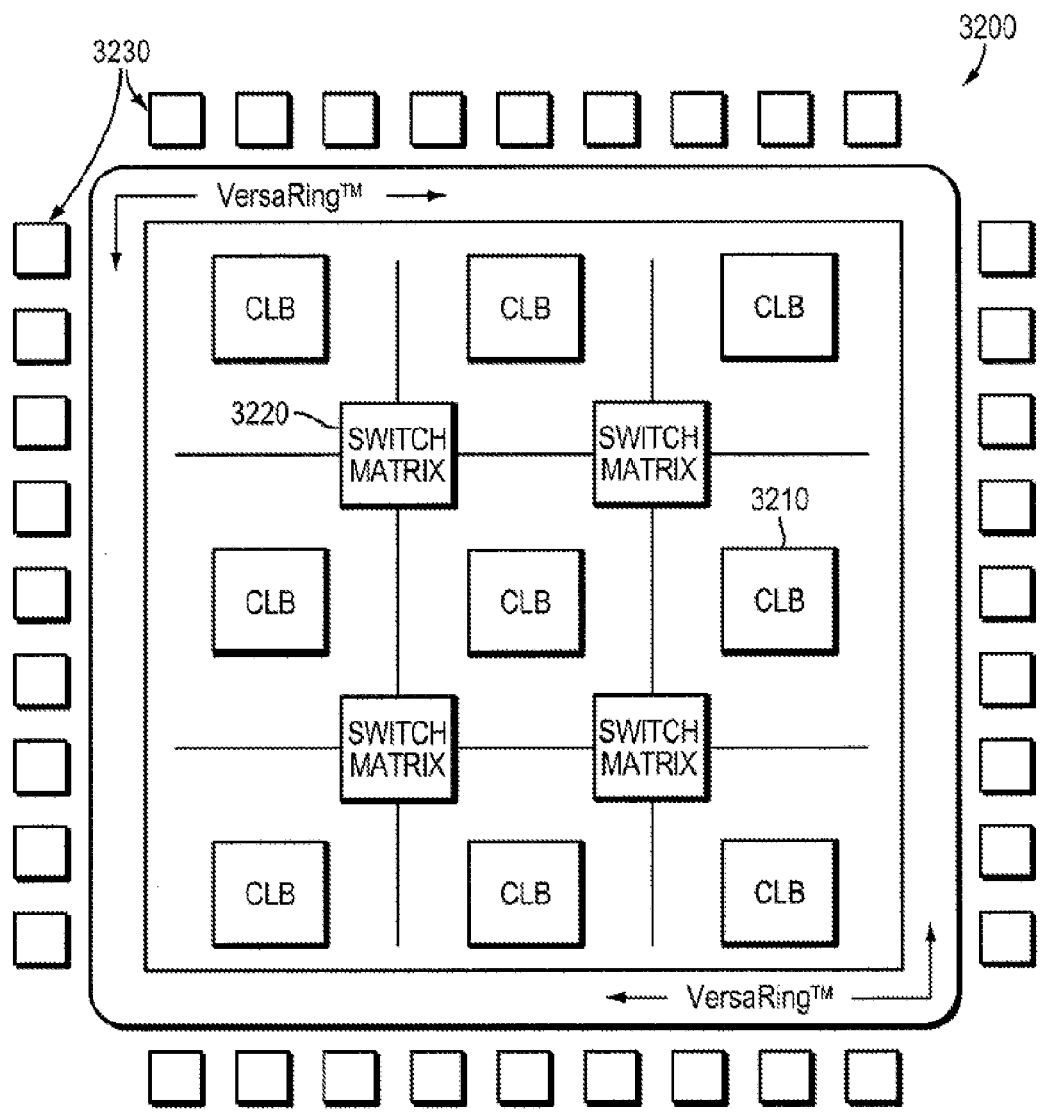
FIG. 32 is a diagram of a field programmable gate array incorporating RTD-based SRAMS formed by ART in accordance with an embodiment of the invention.

Referring to FIG. 32, an exemplary field programmable gate array (FPGA) 3200 incorporates a large number of RTD-based SRAMs fabricated on III-V epitaxial layer structures on Si, e.g., by using ART techniques.

In a typical SRAM-based FPGA system, SRAM cells throughout the FPGA determine the functionality of the device. It typically includes:
 (a) configurable logic block (CLB) 3210. The fixed arrays of CLBs are connectable by a system of pass transistors, driven by SRAM cells. Each CLB typically has two lookup tables (LUT) and two registers;
 (b) switch matrix 3220; and
 (c) input/output block 3230.
SRAM cells are primarily used for three purposes:
 As look-up tables (LUTs) for implementing logic (i.e., as a truth-table).
 As embedded block RAM blocks (for buffer storage, etc.).
 As control to routing and configuration switches.

For the LUT, in addition to their use as general logic "gates," LUTs may alternatively be used as general purpose RAM. Each combination of four LUTs can become a 16×1-bit RAM array.

Example 8

Figure 33:
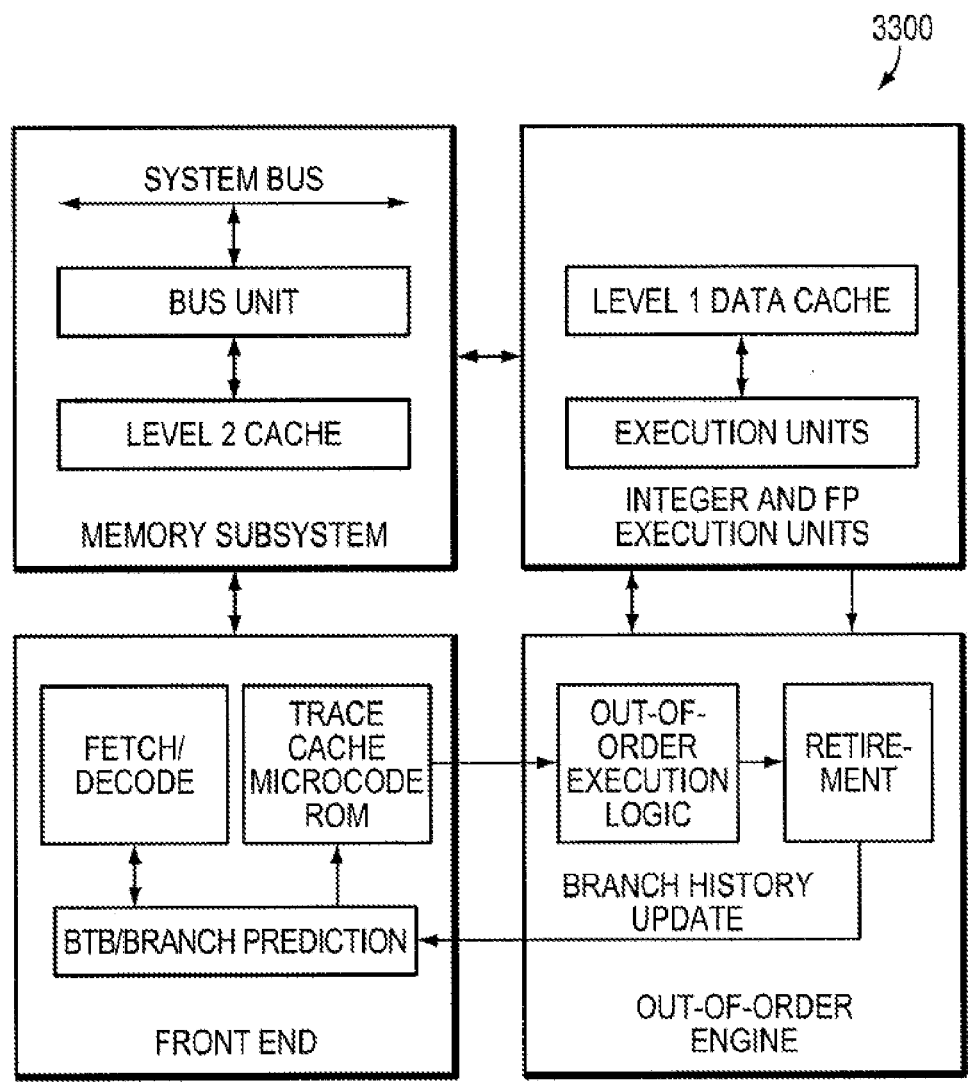
FIGS. 33 and 34 are block diagrams illustrating RTD-based or RTT-based microprocessors formed by ART in accordance with embodiments of the invention.
Figure 34:
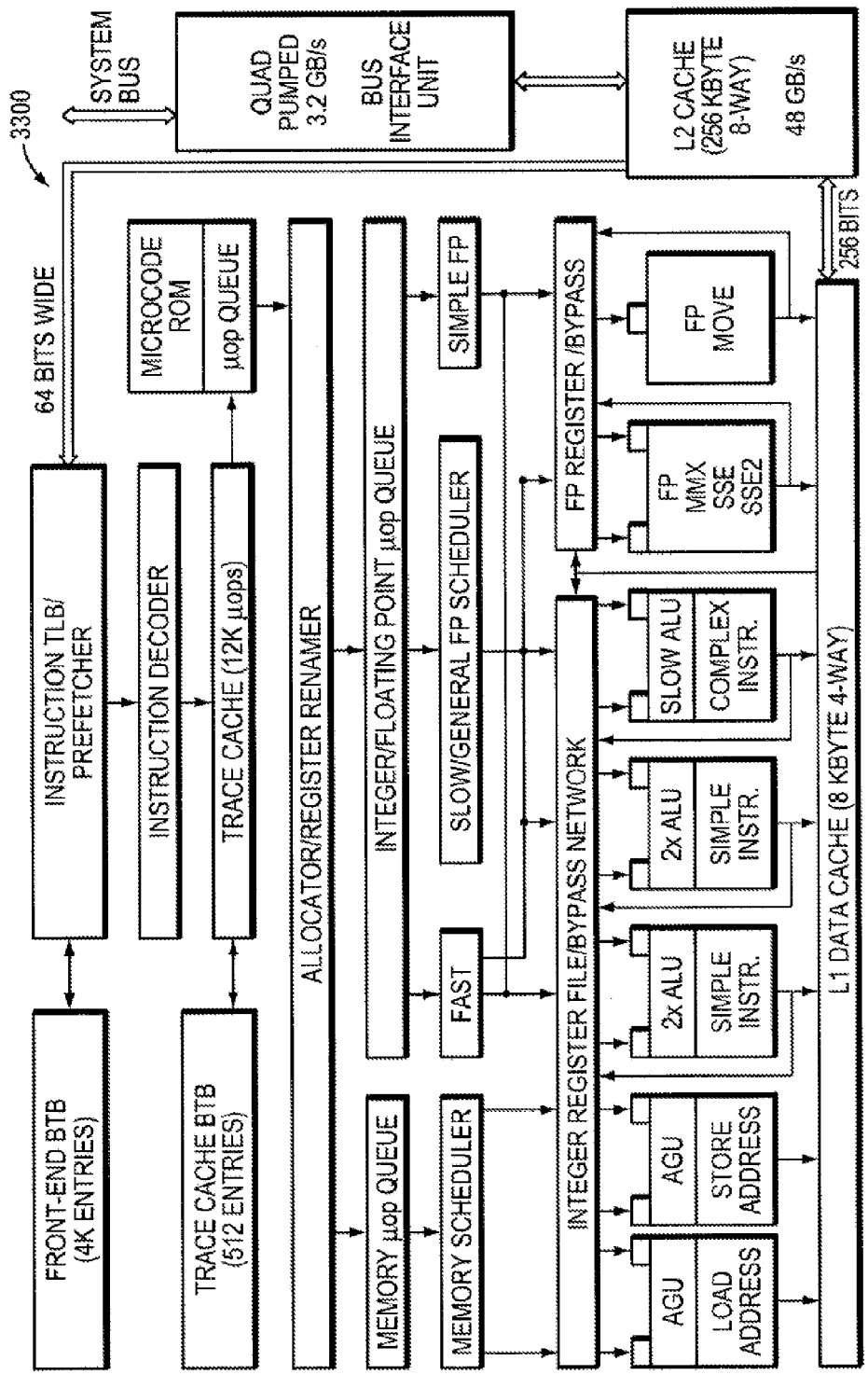

Referring to FIGS. 33 and 34, an exemplary RTD-based or RTT-based microprocessor 3300 is a VLSI device that carries out a range of instructions on data transferred from a register array. Similarly to the previous examples of RTD-based circuitry, the use of RTD or RTT devices significantly reduces the number of devices needed in a circuit, reduces power consumption, and increases speed, in comparison to conventional FET-based microprocessors. The microprocessor 3300 comprises (1) arithmetic logic units (ALUs) that execute a variety of arithmetic and logical function; (2) storage locations (called registers) and memory units which are used to store data, addresses, instructions and control programs, etc; and (3) control systems and interconnection systems that provide links among different components, accept and generate external control signals (such as read and write), and provide timing signals for the entire system, etc.

Using tunneling devices such as RTDs or RTTs for all of three of these components of the microprocessor can provide performance benefits including increased speed and reduced power consumption, thereby improving the basic functionalities of a microprocessor, which include:
 retrieving data from memory;
 manipulating data; and
 storing data in memory.
FIG. 33 shows an exemplary block diagram of a modern microprocessor 3300, and FIG. 34 shows its micro-architecture.

Example 9

Figure 35:
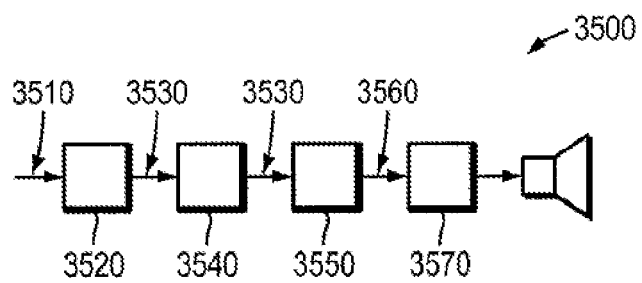
FIG. 35 is a block diagram of an RTD-based digital signal processor formed by ART in accordance with an embodiment of the invention.

Referring to FIG. 35, an RTD-based digital signal processor (DSP) 3500 is a specialized microprocessor designed specifically for processing signal in digital form, generally in real-time. DSPs have at least four major subfields: audio signal processing, control engineering, digital image processing, and speech processing. The baseline DSP includes one arithmetic logic unit (ALU), dual memory interfaces, and a control unit (instruction decoder, branch control, task control). An analog signal 3510 enters the analog-to-digital converter (ADC) 3520. The analog signal is converted to a digital signal 3530 and is processed by a signal processor 3540. The digital signal is transmitted to a digital-analog converter 3550, and an analog signal 3560 is transmitted to an audio amplifier 3570.

A DSP typically has many advantages over its counterpart analog processing system. It is able to provide far better levels of signal processing than is possible with analog hardware alone. It is able to perform mathematical operations that enable many of the spurious effects of the analog components to be overcome. In addition to this, it is possible to easily update a digital signal processor by downloading new software.

Example 10

Figure 36:
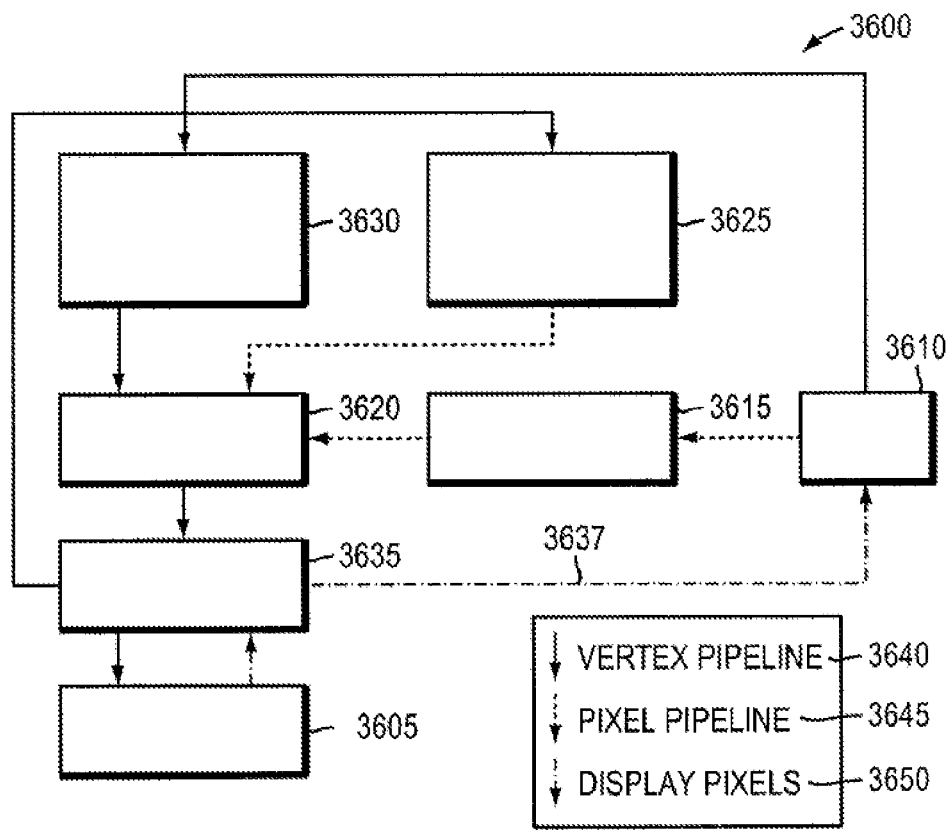
FIG. 36 is a block diagram illustrating an RTD-based graphics processing unit formed by ART in accordance with an embodiment of the invention.

Referring to FIG. 36, an RTD-based graphics processing unit (GPU) 3600 (also called a visual processing unit (VPU)) is a dedicated graphics rendering device for a personal computer or game console that is very efficient at manipulating and displaying computer graphics. Modern GPUs also have support for 3D computer graphics, and typically also include digital video-related functions. GPU 3600 components include an EDRAM 3605, unified memory 3610, texture/vertex fetch 3615, unified shader 3620, primitive setup clipper rasterizer hierarchical Z/S 3625, index stream generator tessellator 3630, and an output buffer 3635, with memory export from the output buffer 3635 to the unified memory 3610. The vertex pipeline 3640, pixel pipeline 3645, and display pixels 3650 are illustrated

III. Structures and Processes for Integrating Tunneling Devices and Conventional Devices into Circuit Units on Si or Common Substrates In various integrated circuit units described in II (Integrated Circuit Units with Tunneling Devices and Conventional Devices), the tunneling devices may be integrated with conventional devices by several different structures and processes, using ART techniques in accordance to one aspect of this invention.

In one embodiment, for example referring to FIG. 22, two RTD (or RITD) devices 400 may be integrated on a semiconductor substrate 405 with a conventional n-FET 1900 to construct an SRAM memory cell unit 2100. The two RTD devices 400 may be connected in series by an underlying doped region 2205, e.g., a p+ Si region defined by implantation. Both RTD devices 400 may be disposed over an n-well 2210 that is electrically isolated from an adjacent p-well 2215 underlying the n-FET 1900. Interconnections (not shown) may be defined between the n-FET 1900 and the two RTD devices 400 to form SRAM memory cell unit 2100.

A typical fabrication process for forming the SRAM memory cell unit 2100 may be summarized as follows. Substrate 405, including a first semiconductor material, is patterned to define an n-FET region and RTD (or RITD) regions. The n-FET device 1900 is fabricated first using the conventional front-end Si CMOS processes. Then, windows in a dielectric 440 layer are defined in RTD/RITD regions. The windows are filled with a second crystalline semiconductor material 410, e.g., a III-V or a II-VI compound, employing ART heteroepitaxy. RTD device layers 425 are formed over the second crystalline semiconductor material 410. Finally, back-end CMOS processing is used to define interconnections between the RTD devices 400 and the n-FET 1900. Issues regarding the thermal budget are mitigated by performing the CMOS front-end processing before the formation of the RTD devices. This sequence is preferable because front-end n-FET fabrication involves high process temperatures, while RTD material may only sustain a low thermal budget. This process is also highly compatible with current Si process.

Referring still to FIG. 22, details of an exemplary fabrication process are now given. The fabrication process may be divided into three phases. n-FETs 1900 are fabricated during the first phase, which essentially is similar to a conventional front-end process of Si CMOS processing; RTDs or RITDs 400 are fabricated in the second phase; and interconnections are made during the third phase, which essentially is similar to the conventional back-end Si CMOS process. As used herein, the terms "front-end processing" and "back-end processing" have the meanings generally understood for these terms. Front-end processing generally refers to all the steps up to and including the formation of a gate and source/drain regions. Back-end generally refers to all the steps performed thereafter to fabricate a CMOS device, i.e., formation of inter-level dielectrics and conductive interconnects.

During the first phase, the substrate is cleaned using a standard RCA clean. A pad oxide of 50 nm is grown on the surface, followed by deposition of a 150 nm layer of silicon nitride. Then windows are etched through the silicon nitride and oxide layers to expose the Si surface in the area of n-well 2210 on which the RTD devices will be defined in third phase. These areas are implanted to form n-well 2210 by, for example, phosphorus implantation to a dose of $5.5E12/cm^2$ at an implantation energy of 100 keV.

Next, a p-well 2215 is similarly formed in the area where the n-FET 1900 will be fabricated. To form a p-well, boron implantation may be used, for example with a dose of $6E12/cm^2$ at 55 keV.

After both n- and p-wells are implanted, a well drive-in anneal is carried out, for example at 1100 degrees C. in a nitrogen ambient. The remaining oxide is etched away.

Next, another pad oxide of 50 nm and another silicon nitride layer 150 nm are deposited over the substrate. A window is etched through the pad oxide and silicon nitride layers to expose the underlying silicon surface only in the n-FET area. In this window, an n-FET 1900 is fabricated. Fabrication of the n-FET includes forming a silicon channel region with appropriate channel implantation, source/drain regions with appropriate source/drain implantation, a gate dielectric layer, and a gate electrode layer with appropriate gate implantation. At least one high temperature annual is conducted to activate the dopant, for example at 1000° C. for 30 minutes.

In the second phase in which the RTD devices 400 are fabricated, and in the third phase in which interconnections are defined, the processes typically have a much lower thermal budget than the first phase.

In the second phase, in an embodiment, the RTD devices 400 are grown after a FET 1900 is defined and after a pre-metal dielectric (PMD) layer is formed, but before a first metal layer is defined. Windows are etched through the dielectric layers on the areas in which RTD devices will be formed to expose the underlying silicon surface. In these windows, a second crystalline semiconductor (e.g., GaAs) 410 and then RTD devices 400 are grown epitaxially using essentially the methods described above. A relatively low temperature anneal may be carried out, for example 700 degrees C. for 1 minute.

In phase three, a back-end process similar to conventional CMOS processing is performed. First, contact windows are etched through the dielectric layer to reach the contact layers of the RTD devices. Another set of contact windows are also made to reach the source/drain/gate contacts of the n-FET. A metal layer, such as Al or Cu, is deposited over the whole surface and into the contact windows. The metal layer is patterned and selectively removed by conventional lithographic and etch processes, leaving behind a pre-determined metal interconnection network that connects the n-FET 1900 and RTD devices 400 into a functional circuit system.

Figure 37:
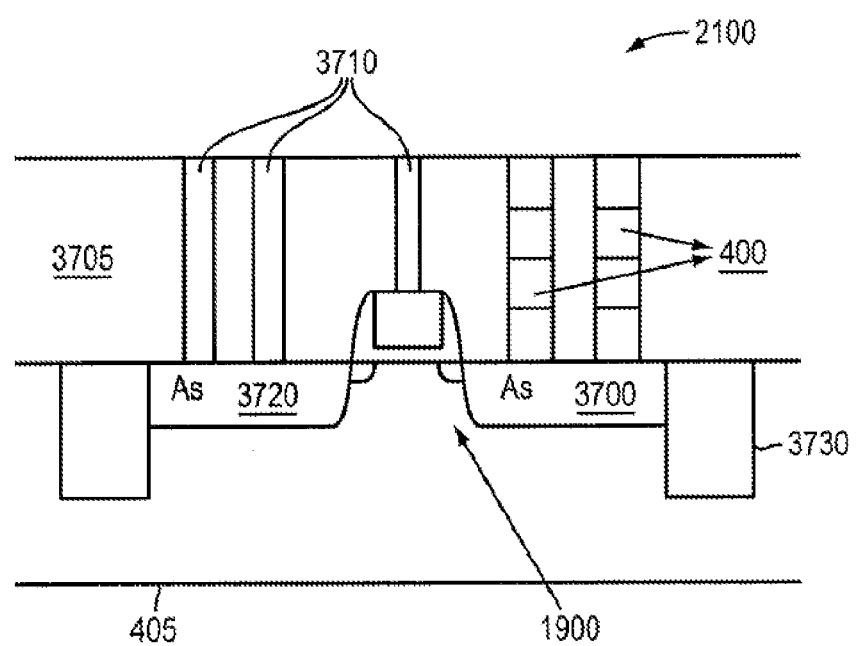
FIG. 37 is a cross-sectional view of a device including two RTDs connected to a drain of a MOSFET, formed by ART in accordance with an embodiment of the invention.

In another embodiment, referring to FIG. 37, two RTD (or RITD) 400 devices may be integrated on a semiconductor substrate 405 with a conventional n-FET 1900 to construct an SRAM memory cell unit 2100. In this structure, the two RTDs 400 are directly connected with the drain region 3700 of the conventional MOSFET 1900. Alternatively, one or both of the RTDs 400 may be coupled to a source 3720 region of the MOSFET 1900. The other process steps may be substantially similar to that in FIG. 22, i.e., a MOSFET 1900 fabricated in the first phase; an RTD 400 fabricated in the second phase; and metal interconnection in the last phase. The resulting structure illustrated in FIG. 37 includes two tunneling structures (in RTDs 400) formed via ART above the drain region 3700 of MOSFET 1900, with the MOSFET bound by a shallow trench isolation region 3730.

In the configuration illustrated in FIG. 37, the size of the RTD 400 is similar to the size of traditional contact holes 3710 for the source and drain. In a typical MOSFET layout, which may have multiple contact holes 3710 formed through a PMD layer 3705 over the source 3720 and/or drain 3700 areas, incorporating the RTDs does not require an additional significant increase in source/drain area.

In yet another embodiment, the tunneling devices 400 and other devices may be fabricated on top of each other, for example, as in the structures in FIGS. 26 and 27. In those structures, the RTDs are fabricated first, before the fabrication of other device structures on the top.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A structure comprising:
a first device on a substrate, the substrate comprising a first crystalline semiconductor material; and
a second device on the substrate and disposed on a second crystalline semiconductor material, the second device comprising a tunneling diode, the first device being electrically coupled to the second device, the second crystalline semiconductor material being lattice mismatched to the first crystalline semiconductor material, defects in the second crystalline semiconductor material arising from the lattice mismatch terminating at a lateral surface of the second crystalline semiconductor material.

2. The structure of claim 1, wherein the first device is on a third crystalline semiconductor material, the third crystalline semiconductor material being lattice mismatched to the first crystalline semiconductor material, defects in the third crystalline semiconductor material arising from the lattice mismatch terminating at a lateral surface of the third crystalline semiconductor material.

3. The structure of claim 1, wherein the first device is disposed at least partially in the first crystalline semiconductor material.

4. The structure of claim 1, wherein the first device comprises a doped region in the first crystalline material, the second crystalline semiconductor material adjoining the doped region.

5. The structure of claim 1, wherein a dielectric sidewall defines the lateral surface of the second crystalline semiconductor material.

6. The structure of claim 1, wherein the first device is a transistor.

7. The structure of claim 1, wherein the first device and the second device are components of a memory cell.

8. The structure of claim 1, wherein the first device and the second device are components of a logic converter.

9. The structure of claim 1 further comprising a third device on the substrate and disposed on a third crystalline semiconductor material, the third device comprising a tunneling diode, the second device being serially coupled to the third device, the third crystalline semiconductor material being lattice mismatched to the first crystalline semiconductor material, defects in the third crystalline semiconductor material arising from the lattice mismatch terminating at a lateral surface of the third crystalline semiconductor material.

10. The structure of claim 1, wherein the first device and the second device are components of a monostable-bistable transition logic element.

11. The structure of claim 1, wherein the first device and the second device are components of a comparator circuit.

12. The structure of claim 1, wherein the first device and the second device are components of a processor.

13. The structure of claim 1, wherein the first device and the second device are components of a clock generator circuit.

14. The structure of claim 1, wherein the first device and the second device are components of a field programmable gate array.

15. A device comprising:
logic circuitry comprising:
a tunneling device disposed on first crystalline material, the first crystalline material being disposed on a substrate, the substrate comprising a second crystalline material, the first crystalline material being lattice mismatched to the second crystalline material, defects in the first crystalline material arising from the lattice mismatch with the second crystalline material terminating at a dielectric sidewall adjoining the second crystalline material; and
a transistor disposed on the substrate and electrically coupled to the tunneling device.

16. The device of claim 15, wherein the logic circuitry is a static random access memory (SRAM) cell.

17. The device of claim 15, wherein the logic circuitry is a logic converter.

18. A structure comprising:
a first crystalline material on a substrate, the first crystalline material having a surface defined by a non-crystalline sidewall, the substrate comprising a second crystalline material, the first crystalline material being lattice mismatched to the second crystalline material, defects in the first crystalline material arising from the lattice mismatch with the second crystalline material terminating at the surface defined by the non-crystalline sidewall, the first crystalline material having a width in a plane parallel to and proximate to a top surface of the substrate and a height in a direction perpendicular to the top surface of the substrate, the height being equal to or greater than half the width; and
a tunneling device disposed over at least a portion of the first crystalline material.

19. The structure of claim 18 further comprising a non-crystalline layer disposed over the top surface of the substrate, the non-crystalline layer having an opening to the top surface of the substrate, the first crystalline material being disposed in the non-crystalline layer.

20. The structure of claim 18, wherein the tunneling device is selected from the group consisting of an Esaki diode (tunnel diode), a single-barrier tunnel diode, a resonant tunneling diode (RTD), a triple-barrier or multiple-barrier resonant tunneling diode, a resonant interband tunneling diode (RITD), a single-barrier interband-tunneling diode, a resonant tunneling transistor (RTT), a resonant tunneling field-effect transistor (RTFET), a double electron layer tunnel transistor (DELTT), a quantum-well-based resonant tunneling transistor (QWBRTT), a resonant tunneling bipolar transistor (RTBT or RBT), and a resonant tunneling hot-electron transistor (RHET).

* * * * *